(12) United States Patent
Pawlowski

(10) Patent No.: US 12,140,870 B2
(45) Date of Patent: Nov. 12, 2024

(54) DOUBLE-SCANNING OPTO-MECHANICAL CONFIGURATIONS TO IMPROVE THROUGHPUT OF PARTICLE INSPECTION SYSTEMS

(71) Applicant: ASML Holding N.V., Veldhoven (NL)

(72) Inventor: Michal Emanuel Pawlowski, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 40 days.

(21) Appl. No.: 18/018,127

(22) PCT Filed: Jul. 20, 2021

(86) PCT No.: PCT/EP2021/070305
§ 371 (c)(1),
(2) Date: Jan. 26, 2023

(87) PCT Pub. No.: WO2022/023129
PCT Pub. Date: Feb. 3, 2022

(65) Prior Publication Data
US 2023/0350308 A1    Nov. 2, 2023

Related U.S. Application Data

(60) Provisional application No. 63/058,558, filed on Jul. 30, 2020.

(51) Int. Cl.
G03F 7/00    (2006.01)
(52) U.S. Cl.
CPC .................. G03F 7/70191 (2013.01)
(58) Field of Classification Search
CPC ............ G03F 7/70191; G03F 7/7085; G03F 7/70908; G03F 1/84; G01N 2021/8845;
(Continued)

(56) References Cited

U.S. PATENT DOCUMENTS 6,952,253 B2    10/2005    Lof et al.
7,511,799 B2    3/2009    Tel et al.
(Continued)

FOREIGN PATENT DOCUMENTS

JP    2004-138470 A    5/2004
JP    6613029 B2    11/2019

OTHER PUBLICATIONS

International Search Report and Written Opinion of the International Searching Authority directed to International Patent Application No. PCT/EP2021/070305, mailed Nov. 2, 2021; 13 pages.
(Continued)

*Primary Examiner* — Hung V Nguyen
(74) *Attorney, Agent, or Firm* — Sterne, Kessler, Goldstein & Fox P.L.L.C.

(57) ABSTRACT

Systems, apparatuses, and methods are provided for increasing the throughput of a particle inspection system. During a first portion of an exposure time period of the particle inspection system, an example method can include irradiating a first region of a substrate surface, blocking all reflected radiation outside the first region, and generating a first sub-image of the first region based on radiation reflected from the first region. During a second portion of the exposure time period, the example method can further include irradiating a second region of the substrate surface, blocking all reflected radiation outside the second region, and generating a second sub-image of the second region based on radiation reflected from the second region. Subsequently, the example method can include generating a composite image based on the first sub-image and the second sub-image.

20 Claims, 22 Drawing Sheets

(58) Field of Classification Search
CPC ....... G01N 2201/0675; G01N 21/8806; G01N 21/94; G01N 21/9501; G01N 21/8851; G01N 2021/8887
See application file for complete search history.

(56) References Cited

U.S. PATENT DOCUMENTS

| | | | |
|---|---|---|---|
| 8,237,835 | B1 | 8/2012 | Muller |
| 10,241,057 | B2* | 3/2019 | Chen .................. G01N 21/8916 |
| 10,677,739 | B2* | 6/2020 | Goers .................... G02B 21/10 |
| 2002/0057431 | A1 | 5/2002 | Fateley et al. |
| 2004/0218172 | A1 | 11/2004 | DeVerse et al. |
| 2008/0239904 | A1* | 10/2008 | Yoshida ............... G11B 19/048 369/53.17 |
| 2015/0215547 | A1 | 7/2015 | Muller |
| 2018/0238812 | A1 | 8/2018 | Chen |

OTHER PUBLICATIONS

"Double-Scanning Opto-Mechanical Configurations To Improve Throughput Of Particle Inspection Systems," Research Disclosure No. 679042, Oct. 3, 2020; 67 pages.

* cited by examiner

DOUBLE-SCANNING OPTO-MECHANICAL CONFIGURATIONS TO IMPROVE THROUGHPUT OF PARTICLE INSPECTION SYSTEMS

CROSS-REFERENCE TO RELATED APPLICATIONS

This application claims priority of U.S. Provisional Patent Application No. 63/058,558, which was filed on Jul. 30, 2020, and which is incorporated herein in its entirety by reference.

TECHNICAL FIELD

The present disclosure relates to lithographic systems, for example, inspection systems for detecting contaminants on a reticle in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

Within the environment of the lithographic apparatus, highly dynamic processes take place, e.g., reticle hand-off, wafer hand-off, controlled gas flows, outgassing of vacuum chamber walls, liquid dispensing (e.g., photoresist coating), temperature variations, metal deposition, rapid movement of numerous actuatable components, and wear of structures. Over time, dynamic processes introduce and build up contaminant particles within the lithographic apparatus. Such contamination may include the presence of particles on the surface of the lithographic patterning device which may affect the etching of the pattern itself and/or subsequent inaccuracies in the patterning process, which may result in damaged and/or non-performing circuits.

Additionally, during an inspection operation, light reflected off of an illuminated pattern may produce a false positive detection indicating to the detector that a particle is present in a location where, in actuality, it is not. False positives can be detrimental to lithography. For example, a false positive detection can slow down production by unnecessarily prompting a maintenance action (e.g., reticle replacement) or even recommending discarding a perfectly conforming reticle. Moreover, such signals may also interfere with other light signals received from the particle at a backside of the lithographic patterning device.

SUMMARY

The present disclosure describes various aspects of systems, apparatuses, and methods for increasing the throughput of a particle inspection system, including, but not limited to, double-scanning opto-mechanical configurations to improve throughput of particle inspection systems.

In some aspects, the present disclosure describes a system. The system can include a radiation system, a spatial filtering system, and an imaging system. The radiation system can be configured to transmit, during a first portion of an exposure time period of the imaging system, a first radiation beam toward a first region of a first surface of a substrate. The radiation system can be further configured to transmit, during a second portion of the exposure time period, a second radiation beam toward a second region of the first surface of the substrate. The spatial filtering system can be configured to block, during the exposure time period, radiation reflected from a second surface of the substrate disposed opposite the first surface of the substrate. The imaging system can be configured to capture, during the first portion of the exposure time period, a first sub-image of the first region based on first radiation scattered from the first region in response to a first irradiation of the first region by the first radiation beam. The imaging system can be further configured to capture, during the second portion of the exposure time period, a second sub-image of the second region based on second radiation scattered from the second region in response to a second irradiation of the second region by the second radiation beam. The imaging system can be further configured to generate a composite image based on the first sub-image and the second sub-image. In some aspects, the second region of the first surface of the substrate can include a particle, and the imaging system can be further configured to detect the particle based on the composite image.

In some aspects, the second region can overlap the first region. In other aspects, the second region may not overlap the first region. In some aspects, the first region can define a first rectangle, a first square, a first triangle, a first circle, any other suitable region, or any combination thereof. In some aspects, the second region can define a second rectangle, a second square, a second triangle, a second circle, any other suitable region, or any combination thereof.

In some aspects, the radiation system can include a radiation source configured to generate the first radiation beam and the second radiation beam. In other aspects, the radiation system can include a first radiation source configured to generate the first radiation beam and a second radiation source configured to generate the second radiation beam. In some aspects, the first radiation beam can include a first spectrum. In some aspects, the second radiation beam can include a second spectrum. For example, the first spectrum can correspond to a white light spectrum or any other suitable spectrum, such as a single-wavelength spectrum (e.g., red, green, blue, or one of 255 grayscale intensities) or a multi-wavelength spectrum. In some aspects, the first spectrum can be about equal to the second spectrum.

In some aspects, the radiation system can include a first spatial electro-optic modulator configured to transmit, during the first portion of the exposure time period, the first radiation beam toward the first region of the first surface of the substrate. The first spatial electro-optic modulator can be further configured to transmit, during the second portion of the exposure time period, the second radiation beam toward the second region of the first surface of the substrate. In some aspects, the first spatial electro-optic modulator can include a first set of slits. For example, the first spatial electro-optic modulator can include a first digital mirror device (DMD) or a first liquid crystal modulator (LCM).

In some aspects, the imaging system can include the spatial filtering system and an imaging device. In some aspects, the exposure time can be an exposure time of the imaging device. In some aspects, a field of view of the imaging device during the exposure time can include the first region of the first surface of the substrate and the second region of the first surface of the substrate.

In one example configuration, the spatial filtering system can include a second spatial electro-optic modulator configured to block the radiation reflected from the second surface of the substrate. In some aspects, the second spatial electro-optic modulator can include a second set of slits. For example, the second spatial electro-optic modulator can include a second DMD or a second LCM.

In another example configuration, the spatial filtering system can be implemented based on a rolling shutter acquisition mode of the imaging device. For example, the first region can define a first line corresponding to a first actively-exposed row of the imaging device, and the second region can define a second line different from the first line corresponding to a second actively-exposed row of the imaging device.

In yet another example configuration, the spatial filtering system can be implemented based on a region of interest (ROI) acquisition mode of the imaging device. For example, the first region can define a first rectangular area corresponding to a first actively-exposed area of the imaging device, and the second region can define a second rectangular area corresponding to a second actively-exposed area of the imaging device.

In some aspects, the present disclosure describes an apparatus. The apparatus can include a radiation system and an imaging system. The radiation system can be configured to emit, during a first portion of an exposure time period, a first radiation beam toward a first region of a first surface of a substrate at a first incident angle. The radiation system can be further configured to emit, during a second portion of the exposure time period, a second radiation beam toward a second region of the first surface of the substrate at a second incident angle. The imaging system can be configured to block, during the first portion of the exposure time period, radiation reflected from a second surface of the substrate disposed opposite the first surface of the substrate. The imaging system can be further configured to capture, during the first portion of the exposure time period, a first sub-image of the first region of the first surface of the substrate. The imaging system can be further configured to capture, during the second portion of the exposure time period, a second sub-image of the second region of the first surface of the substrate. The imaging system can be further configured to generate a composite image based on the first sub-image and the second sub-image.

In some aspects, the present disclosure describes a method for increasing the throughput of a particle inspection system. The method can include irradiating, by a radiation system during a first portion of an exposure time period, a first region of a first surface of a substrate. The method can further include irradiating, by the radiation system during a second portion of the exposure time period, a second region of the first surface of the substrate. The method can further include blocking, by a spatial filtering system during the exposure time period, radiation reflected from a second surface of the substrate disposed opposite the first surface of the substrate. The method can further include generating, by an imaging system during the first portion of the exposure time period, a first sub-image of the first region of the first surface of the substrate. The method can further include generating, by the imaging system during the second portion of the exposure time period, a second sub-image of the second region of the first surface of the substrate. The method can further include generating, by the imaging system, a composite image based on the first sub-image and the second sub-image.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
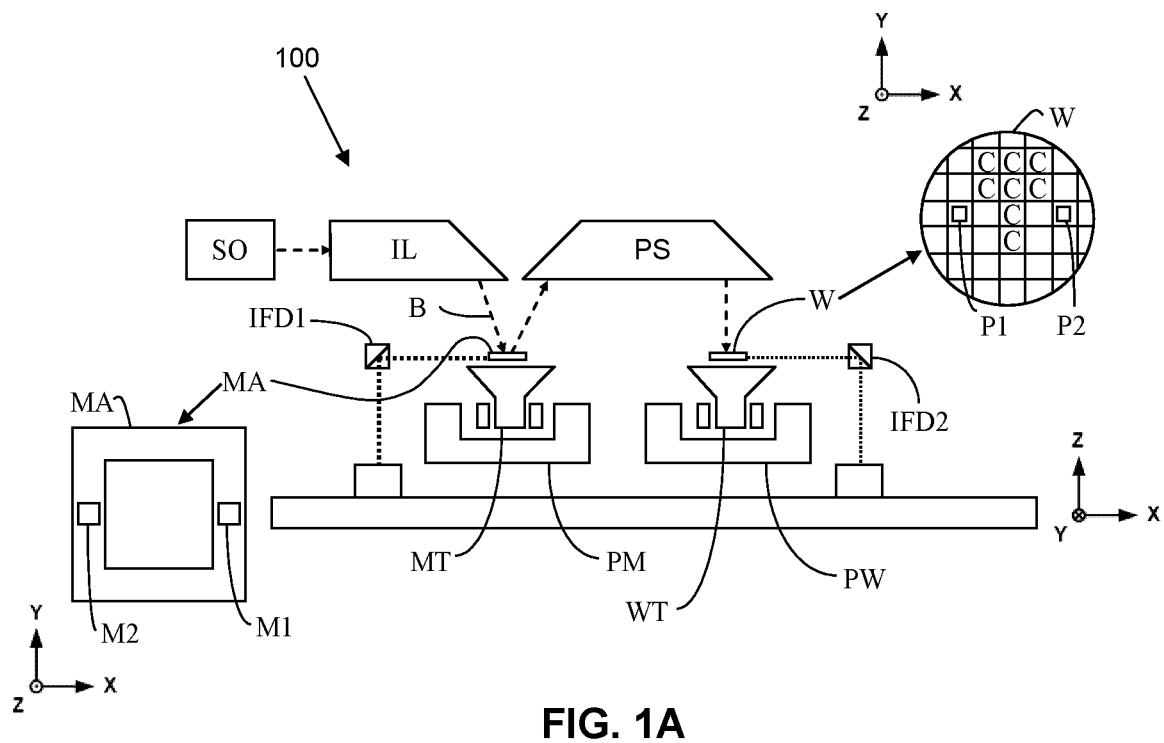
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

The term "non-transitory" may be used herein to characterize computer readable media used for storing data, information, instructions, and the like, with the sole exception being a transitory, propagating signal.

The term "substrate" as used herein describes a material onto which material layers are added. In some aspects, the substrate itself can be patterned and materials added on top of it can also be patterned, or can remain without patterning.

The term "particle" as used herein is to be understood broadly to include particles, contaminants, imperfections, defects, blemishes, and the like. The terms "imperfection," "defect," "blemish," and the like may be used herein to refer to deviations or non-uniformities of structures from a specified tolerance. For example, a flat surface may have defects such as scratches, holes, or recesses, foreign particles, stains, and the like. In the context of imperfections, the terms "foreign particle," "contaminant particle," "contaminant," and the like may be used herein to refer to unexpected, atypical, or undesirable particulate matter that is present in a region or on a surface that was not designed to tolerate the presence of the undesirable particulate matter or otherwise adversely impacts operation of the apparatus on which the particulate matter is present. Examples of foreign particles can include dust, stray photoresist, or other dislodged materials within the lithographic apparatus. Examples of dislodged materials can include steel, Au, Ag, Al, Cu, Pd, Pt, Ti, and the like. Material dislodging can occur due to, e.g., processes of fabricating metal interconnects on substrates and friction and impacts of actuated structures. Contaminants can make their way onto sensitive parts in the lithographic apparatus (e.g., reticles, substrates) and increase the likelihood of errors in lithographic processes.

Overview

In some aspects, a particle inspection system can be used to inspect an object in order to determine a cleanliness of the object. Inspection techniques can be performed such that undesirable defects on a surface (e.g., a surface of a reticle, pellicle, or substrate) are successfully detected while minimizing false detections (e.g., false positives). Inspection techniques can comprise electro-optical inspection.

In some aspects, the quality of a lithographic process can highly depend on cleanliness. Accordingly, in order to suitably reproduce a master pattern, a particle inspection system can be utilized to inspect both sides of a reticle, including the backside of the reticle as well as the pellicle disposed over the frontside of the reticle containing the master pattern.

In some aspects, a particle inspection system (e.g., a reticle inspection system) can check the backside of a reticle and the frontside of the reticle for presence of particles. Yet traditional particle inspection systems can suffer from several problems, such as unreliable measurement of the size of detected particles (e.g., scatterometry-based systems can use an experimentally-derived size-intensity curve to report the size of detected contamination as a polystyrene latex (PSL) equivalent size, which can be orders of magnitude different from the physical size of the actual particle). In addition, particle inspection systems can suffer from false positive detections (e.g., stray light coupled into the detection system due to the diffractive properties of the reticle can be incorrectly identified as contamination).

To address these problems, current particle detection systems can assess particle size using high-resolution imaging systems and eliminate false positive detections using Region of Interest (ROI) illumination-acquisition techniques and Amplitude Modulation (AM) structural illumination techniques. Example ROI illumination-acquisition systems and techniques are described in, for example, U.S. Provisional Patent Application No. 62/964,924, filed Jan. 23, 2020, and titled "Systems and Methods for Region of Interest Processing for Particle Detection," and U.S. Provisional Patent Application No. 63/036,744, filed Jun. 9, 2020, and titled "Method for Region of Interest Processing for Reticle Particle Detection," each of which is hereby incorporated by reference in its entirety. Example AM structural illumination systems and techniques are described in, for example, U.S. Provisional Patent Application No. 62/955,883, filed Dec. 31, 2019, and titled "Contaminant Detection Metrology System, Lithographic Apparatus, and Methods Thereof," which is hereby incorporated by reference in its entirety.

However, some ROI illumination-acquisition techniques can limit system throughput. In particular, ROI illumination-acquisition techniques can be very robust in the elimination of unwanted stray light (e.g., stray light generated through one diffraction/reflection/scattering event) but require acquisition of multiple images to cover the entire field of view of the imaging detector. Since complementary metal-oxide-semiconductor (CMOS) and charge-coupled device (CCD) detectors can be optimized for acquiring full-frame data, some ROI illumination-acquisition techniques can record images only partially filled with useful information and thus tax transmission line bandwidth resulting in slowing down measurement operations. While some detectors can define the portion of a captured image to be analyzed and transmitted (e.g., CMOS detectors can limit the shape of a selected sub-region of the detector to a rectangle or, in some aspects, multiple non-overlapping rectangles), these and other detectors can require a time equal to multiple frame times to program their on-board control units to restrict image acquisition to a restricted subset of pixels, substantially negating some of the potential improvements of reduced image size and increased frame rate. Thus, there is a need to provide improved particle inspection systems and techniques that can detect contaminants on optically critical components of a lithographic apparatus in a faster, more computationally-efficient manner. In particular, there is a need to increase the throughput of particle detection systems that utilize ROI illumination-acquisition techniques.

In contrast, some aspects of the present disclosure can provide for increasing the throughput of particle inspection systems and imaging systems that utilize ROI illumination-acquisition techniques. In some aspects, the present disclosure provides for acquiring multiple ROI images (e.g., three ROI images) within a single integration cycle of an imaging detector. In some aspects, the present disclosure further provides for selectively blocking radiation that would otherwise lead to a false positive detection from being acquired by the imaging device. In some aspects, a spatial filtering system included in the imaging system can be utilized to implement the selective blocking techniques disclosed herein. In some aspects, the spatial filtering system can be implemented according to one the following configurations: (1) a synchronized double-scan opto-mechanical system utilizing an imaging device (e.g., camera) and at least two spatial electro-optical modulators (e.g., as described with reference to FIGS. 6A, 6B, and 6C); (2) a synchronized ROI illumination-acquisition system utilizing an imaging device implementing a modified rolling shutter exposure mode (e.g., as described with reference to FIGS. 7A, 7B, 9A, 9B, and 9C); and (3) a synchronized ROI illumination-acquisition system utilizing an imaging device implementing a modified ROI acquisition mode (e.g., as described with reference to FIGS. 8A, 8B, 9A, 9B, and 9C). In some aspects, the imaging device can be configured to acquire sequentially multiple ROIs in single image frame (e.g., as described with reference to FIGS. 5, 7A, and 8A). In some aspects, a secondary spatial electro-optical modulator can be used to act as a shutter or variable attenuator to extend the dynamic range of acquired images. In some aspects, a variant of the synchronized double-scan opto-mechanical system can be implemented without the use of a second spatio-electro-optical modulator by utilizing active on-the-fly reprogramming of the area of detector that is temporary sensitive to light. It should be notated that in proposed configuration, There are many exemplary aspects to the systems, apparatuses, methods, and computer program products disclosed herein. For example, aspects of the present disclosure provide for, among other aspects: improved throughput of particle detection systems; implementation of multiple scanning modes (e.g., point, line, area); akinetic scanning using spatial electro-optical modulators such as DMDs, LCMs, or both; no need for stitching of ROIs; simpler data processing techniques (e.g., no need for stitching of ROIs; no need to reject non-ROI portion of detector); and optimal use of data bandwidth. As a result of the techniques described in the present disclosure solves at least one of the problems of ROI illumination-acquisition techniques that limit system throughput by increasing system throughput and bandwidth utilization each by at least a factor of three (e.g., by acquiring at least three ROI images during a single exposure of the imaging device).

Before describing such aspects in more detail, however, it is instructive to present an example environment in which aspects of the present disclosure can be implemented.

Example Lithographic Systems

Figure 1B:
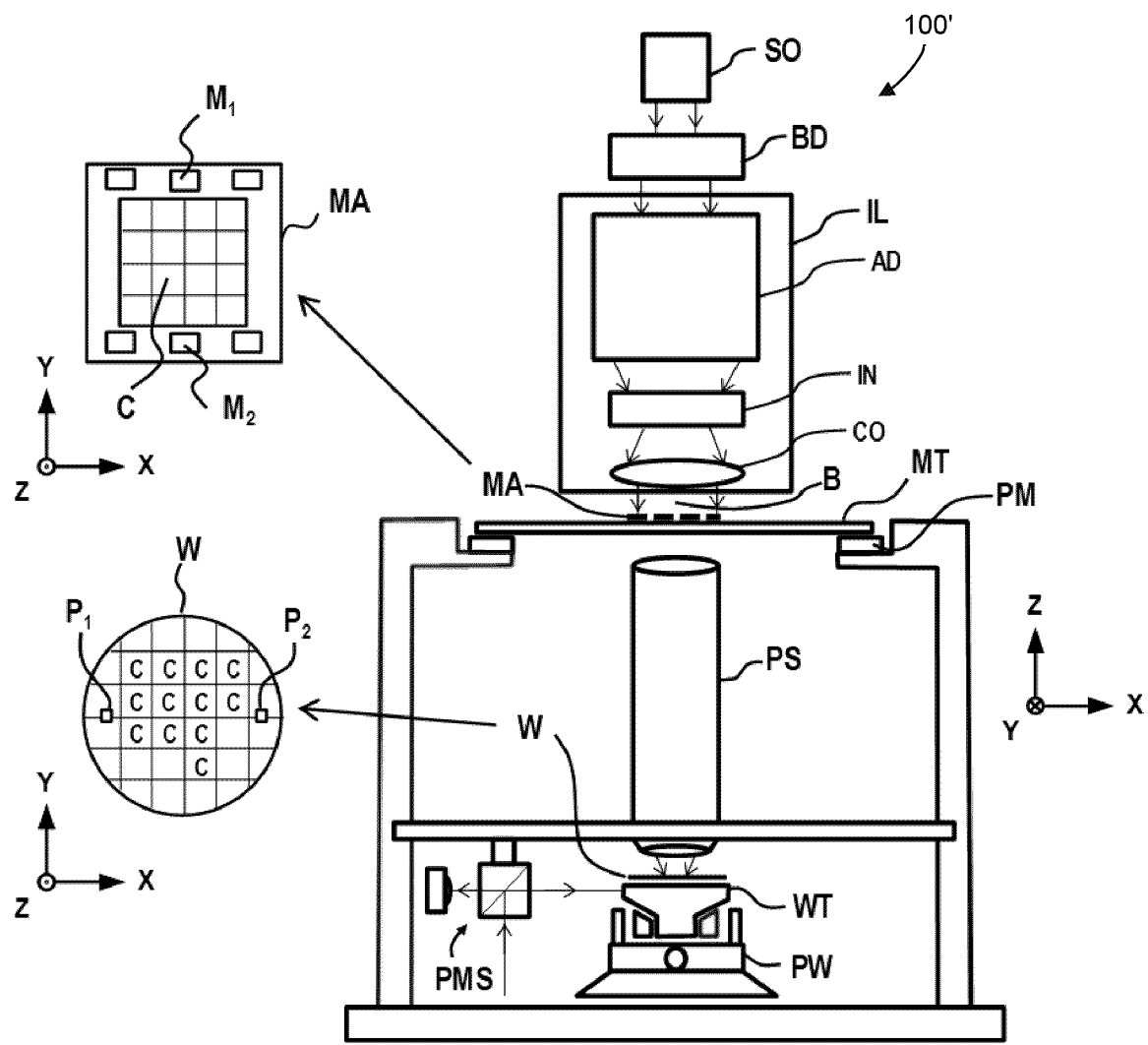
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view)

that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Reflected light (e.g., zeroth-order diffracted beams) traverses the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks) Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:
1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.
2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.
3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
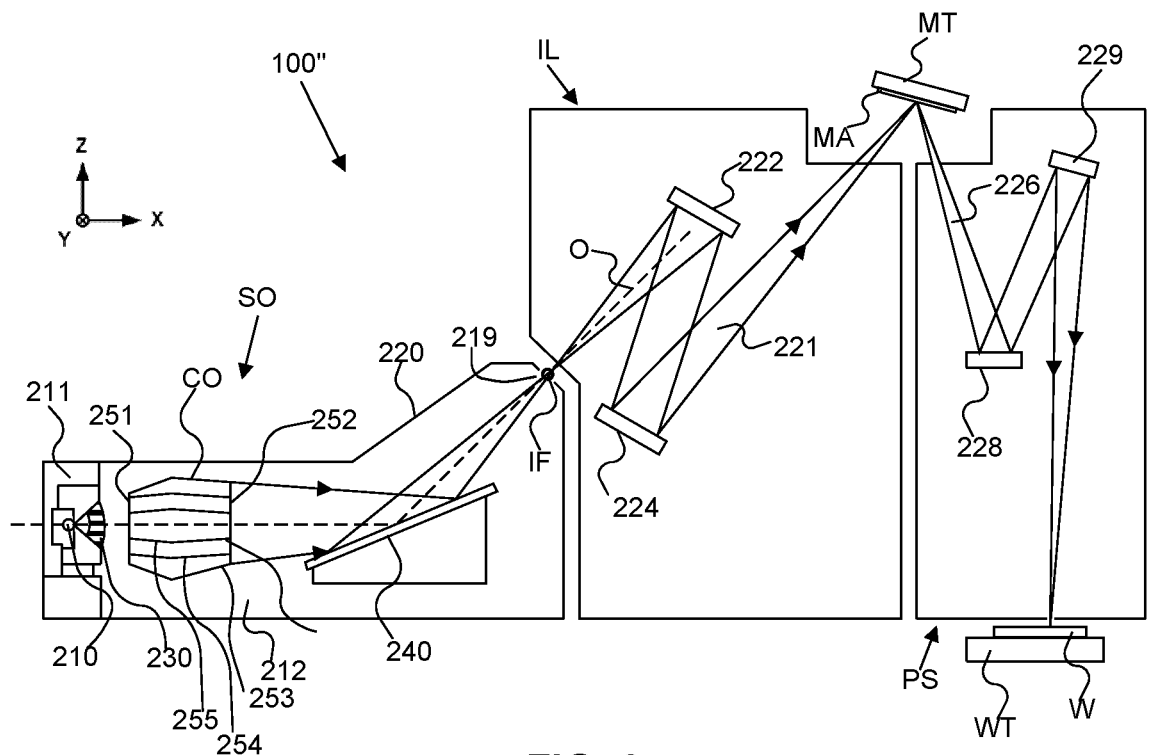
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
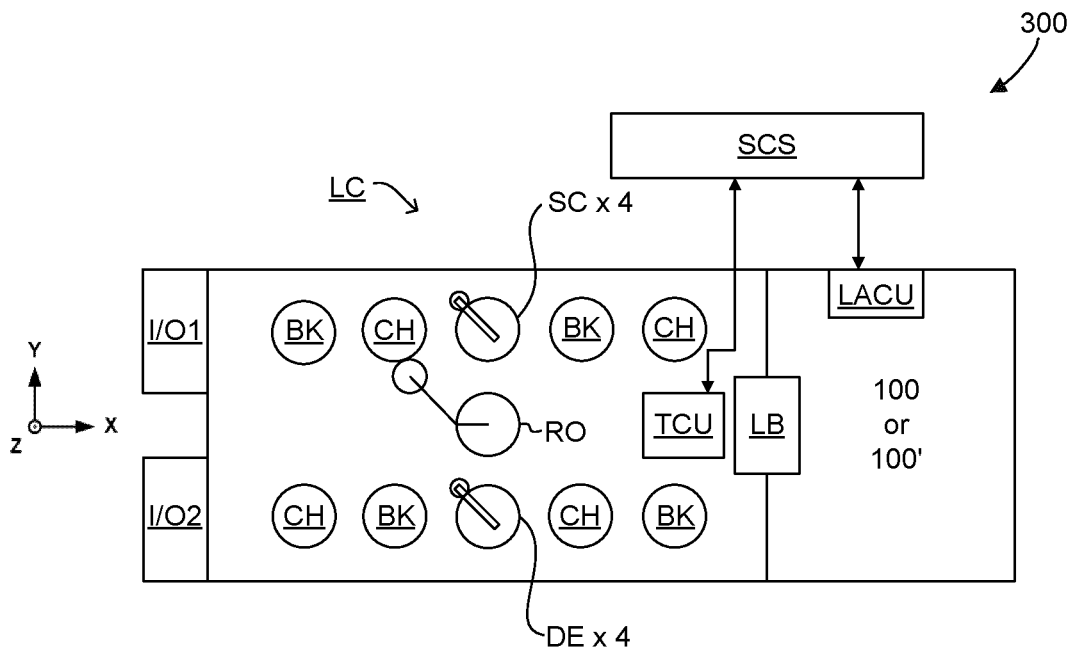
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Particle Inspection Systems and Techniques

FIGS. 4A, 4B, 4C, 4D, 4E, and 4F provide schematic illustrations of an example particle inspection system 400 according to some aspects of the present disclosure. The example particle inspection system 400 can include a radiation system 402, an imaging system 404, a focusing system 408 (e.g., a focus sensor), and a particle inspection controller 406 (e.g., example computing system 1100 described with reference to FIG. 11). The example particle inspection system 400 can be configured to inspect a reticle 410 and a pellicle 412 for contamination. A surface 412a of the pellicle 412 can be placed on an XYZ stage 414 whose position is controllable by one or more electro-mechanical actuators (e.g., one or more servo motors and servo controllers) communicatively coupled to the particle inspection controller 406. In some aspects, as described herein, the example particle inspection system 400 can be configured to detect particles (e.g., particle 430, 470) disposed on a surface 410a of the reticle 410, the surface 412a of the pellicle 412, or both at an increased throughput and bandwidth utilization without detecting false positives due to radiation reflected from a pattern 410b of the reticle 410. In some aspects, the imaging system 404 can include a spatial filtering system and an imaging device (e.g., a CMOS or CCD detector). In some aspects, the spatial filtering system can be configured to block radiation reflected from the pattern 410b of the reticle 410 using, for example, a spatial electro-optic modulator (e.g., a DMD or LCM), a rolling shutter acquisition mode of the imaging device, an ROI acquisition mode of the imaging device, or any other suitable technique.

In some aspects, during a single integration cycle or exposure event of the imaging system 404 (e.g., during a single exposure of the imaging device included in the imaging system 404), the example particle inspection system 400 can be configured to sequentially acquire multiple ROI images within a single image frame corresponding to a field of view 420 of the imaging system 404. In some aspects, the field of view 420 of the imaging system 404 during the exposure time period can include a region 422, a region 424, and a region 426. In some aspects, the multiple ROI images can include a first sub-image acquired from the region 422, a second sub-image acquired from the region 424, and a third sub-image acquired from the region 426.

In some aspects, the regions 422, 424, and 426 may not overlap each other. In other aspects, the regions 422, 424, and 426 can partially overlap each other. In some aspects, the region 422, the region 424, the region 426, or a combination thereof can define a rectangle, a square, a triangle, a circle, a line, or any other suitable shape. In some aspects, the field of view 420 can consist of multiple, separated sub-regions. For example, the region 422 can include a combination of a circle located in the top-left corner of the field of view 420 and a rectangle located at the bottom of the field of view 420. In some aspects, the example particle inspection system 400 can utilize separated ROIs to increase coverage of the field of view 420 or to overcome possible limitations of the imaging system 404 (e.g., limited depth-of-field) when the measured surface is not flat (e.g., as can be the case during measurement of the surface 412a of the pellicle 412 mounted in front of the pattern 410b of the reticle 410).

In some aspects, the example particle inspection system 400 can be configured to increase throughput and bandwidth utilization by performing the following operations sequentially during a single exposure event of the imaging system 404. First, the radiation system 402 can selectively irradiate region n on the surface 410a or the surface 412a, where n corresponds to an integer between one and the total number of regions N. Second, the imaging system 404 (e.g., equipped with either an electronic or opto-electronic spatial filter) can selectively acquire radiation reflected or scattered from region n and selectively block radiation not coming from region n. Third, the radiation system 402, in sync with the imaging system 404 and the XYZ stage 414, can scan or step through n regions within the field of view 420 of the imaging system 404.

In some aspects, the example particle inspection system 400 can be configured to (i) generate (e.g., capture, acquire, including, in some aspects, image post-processing or compression) a first sub-image based on irradiation (e.g., illumination) of the region 422 of the surface 410a of the reticle 410 during a first portion $\Delta t_{i,1}$ of an exposure time period $\Delta t_i$ of the imaging system 404, (ii) generate a second sub-image based on irradiation and acquisition of the region 424 of the surface 410a of the reticle 410 during a second portion $\Delta t_{i,2}$ of the exposure time period $\Delta t_i$, (iii) generate a third sub-image based on irradiation and acquisition of the region 426 of the surface 410a of the reticle 410 during a third portion $\Delta t_{i,3}$ of the exposure time period $\Delta t_i$, where the subscript "i" is an integer value denoting the i-th exposure time period of the imaging device and the subscripts "1," "2," and "3" denote the first, second, and third portions of the i-th exposure time period, respectively. In some aspects, the example particle inspection system 400 can be further configured to generate a composite image corresponding to the field of view 420 based on the first sub-image, the second sub-image, and the third sub-image.

In some aspects, the example particle inspection system 400 can utilize an ROI illumination-acquisition technique in which the reticle 410, the pellicle 412, or both are off-axis irradiated (e.g., illuminated) by the radiation system 402. In some aspects, the irradiation direction and size of the irradiated area can be configured such that: from the perspective of the imaging system 404, the pattern 410b as observed by the imaging system 404 through the ROI is not directly irradiated by the radiation system 402; particles within the ROI (e.g., particle 430 within the region 424) can be images in dark field mode; the field of view of the imaging system 404 can be divided into multiple ROIs; and the ROIs can be stitched together during post-processing to reconstruct the continuously illuminated field of view free of "direct reflections" (e.g., light redirected by the pattern 410b in one scattering/diffraction/reflection event). In some aspects, the irradiated portion of the field of view of the imaging system 404 can be limited to an area where a dark field illumination condition is met.

Figure 4A:
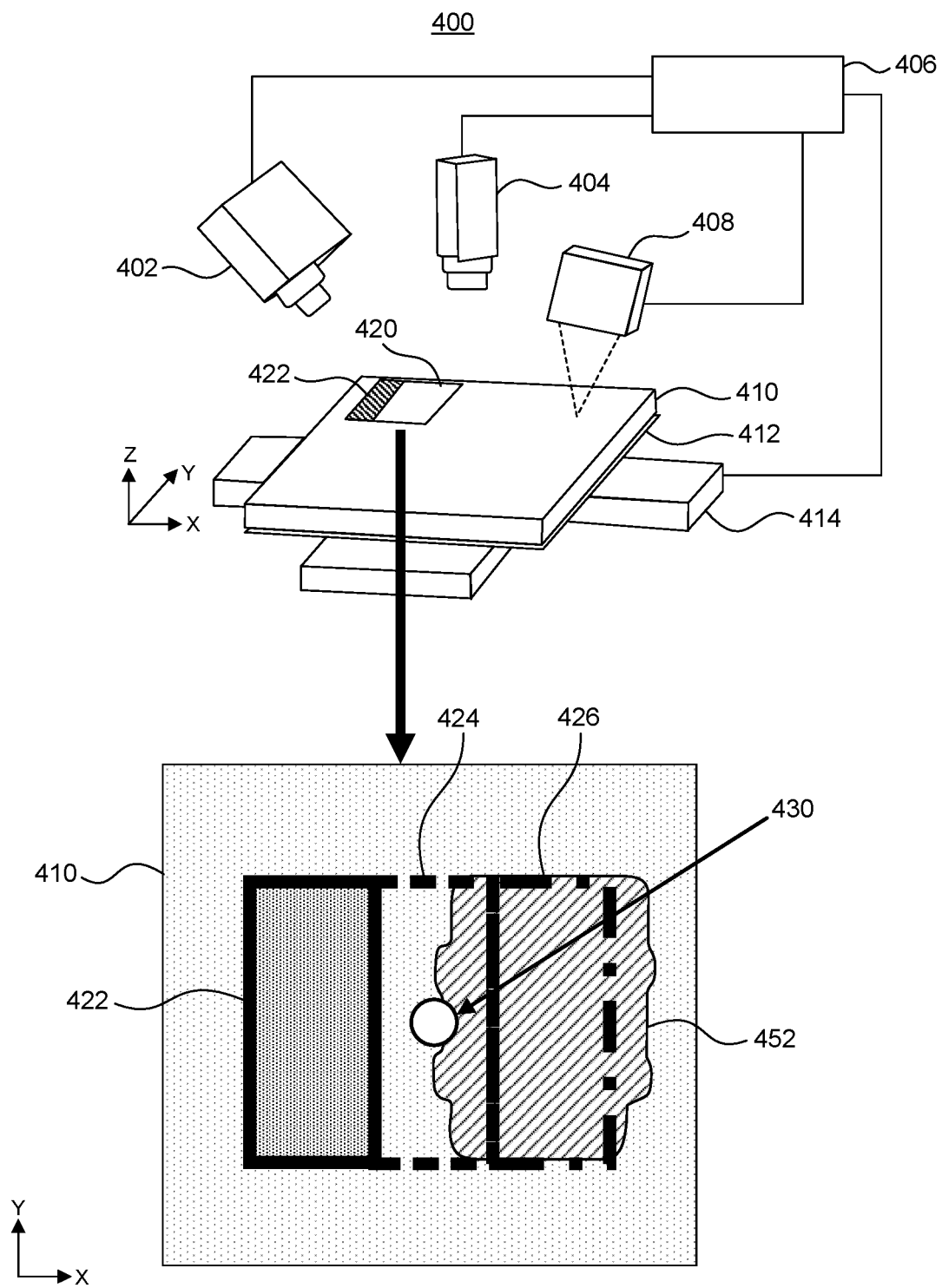
FIGS. 4A, 4B, 4C, 4D, 4E, and 4F are schematic illustrations of an example particle inspection system according to some aspects of the present disclosure.
Figure 4B:
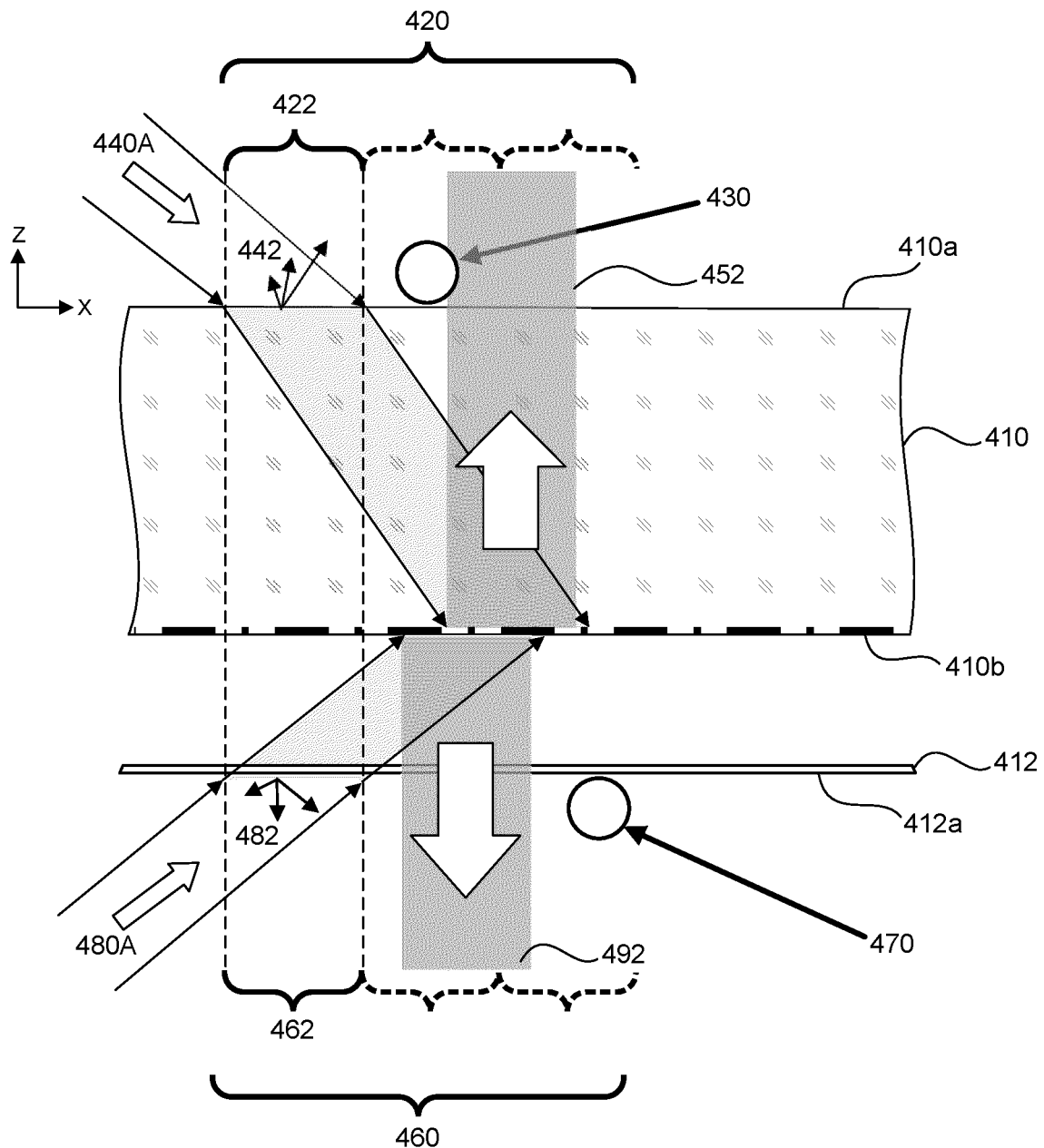

FIGS. 4A and 4B illustrate operations that the example particle inspection system 400 can perform during the first portion $\Delta t_{i,1}$ of the exposure time period $\Delta t_i$ of the imaging system 404. In some aspects, during the first portion $\Delta t_{i,1}$ of the exposure time period $\Delta t_i$, the radiation system 402 can be configured to irradiate the region 422 of the surface 410a of the reticle 410. For example, during the first portion $\Delta t_{i,1}$ of the exposure time period $\Delta t_i$, the radiation system 402 can transmit (e.g., emit) a radiation beam 440A toward the region 422 of the surface 410a of the reticle 410 at a first off-axis incident angle. In some aspects, during the first portion $\Delta t_{i,1}$ of the exposure time period $\Delta t_i$, the imaging system 404 can be configured to block (e.g., using a spatial filtering system) radiation 452 reflected from the pattern 410b of the reticle 410. In some aspects, during the first portion $\Delta t_{i,1}$ of the exposure time period $\Delta t_i$, the imaging system 404 can be configured to generate a sub-image of the region 422 based on radiation 442 scattered from the region 422 in response to the irradiation of the region 422 by the radiation beam 440A.

In some aspects, during the first portion $\Delta t_{i,1}$ of the exposure time period $\Delta t_i$, the radiation system 402 can be further configured to irradiate a region 462 of the surface 412a of the pellicle 412. For example, during the first portion $\Delta t_{i,1}$ of the exposure time period $\Delta t_i$, the radiation system 402 can transmit a radiation beam 480A toward the region 462 of the surface 412a of the pellicle 412 at a second off-axis incident angle. In some aspects, during the first portion $\Delta t_{i,1}$ of the exposure time period $\Delta t_i$, the imaging system 404 can be configured to block (e.g., using a spatial filtering system) radiation 492 reflected from the pattern 410b of the reticle 410. In some aspects, during the first portion $\Delta t_{i,1}$ of the exposure time period $\Delta t_i$, the imaging system 404 can be configured to generate a sub-image of the region 462 based on radiation 482 scattered from the region 462 in response to the irradiation of the region 462 by the radiation beam 480A.

Figure 4C:
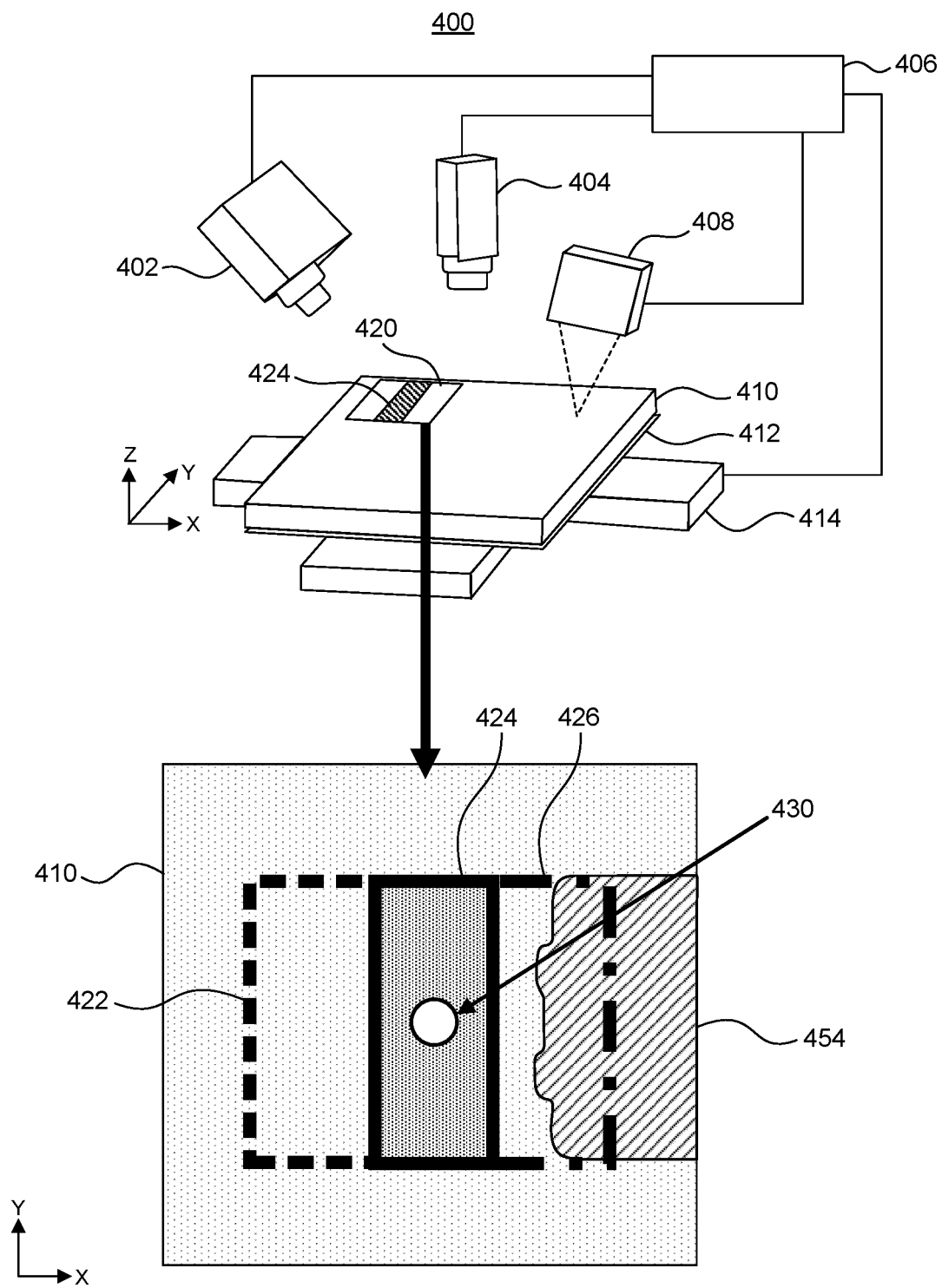
Figure 4D:
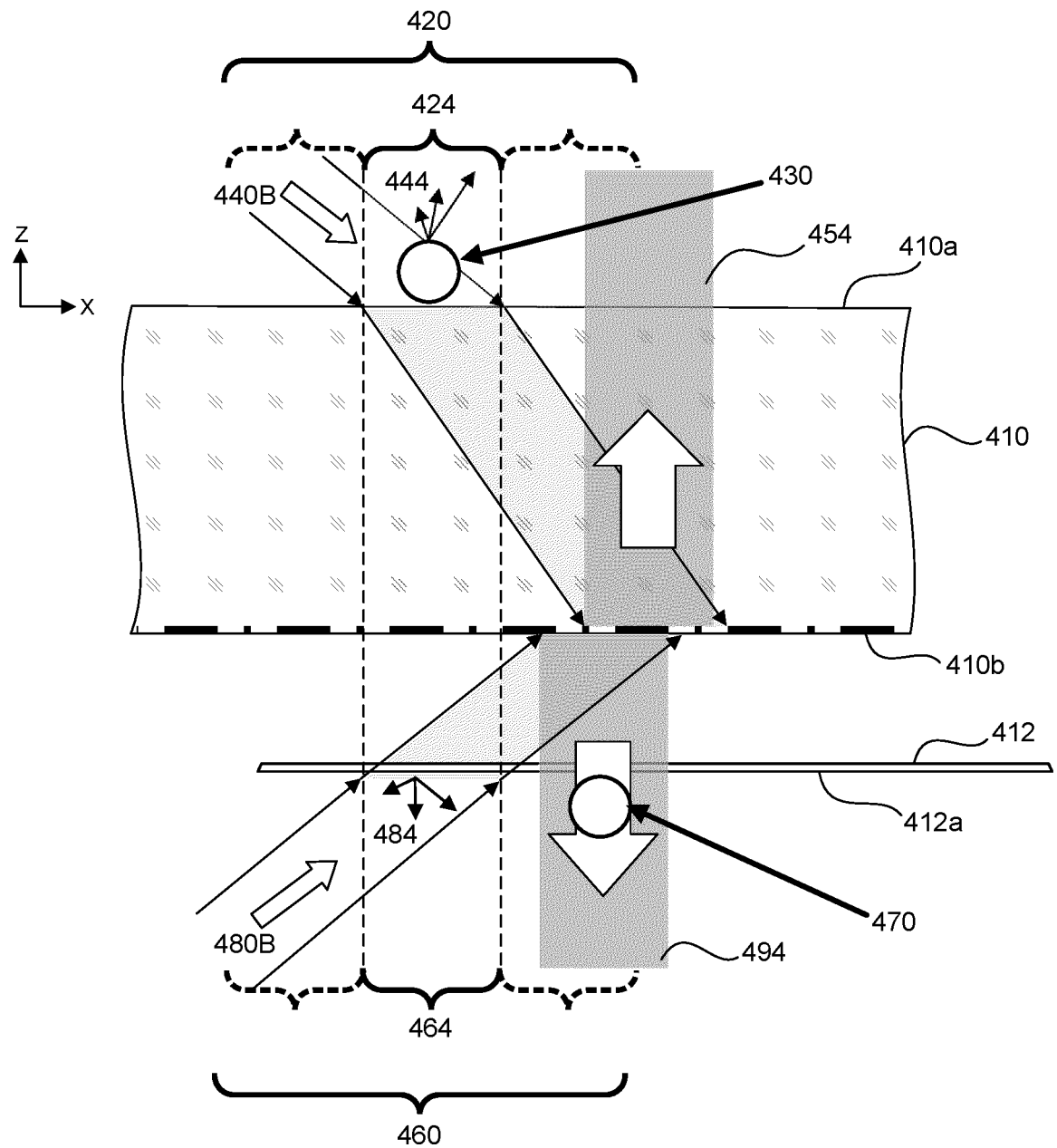

FIGS. 4C and 4D illustrate operations that the example particle inspection system 400 can perform during the second portion $\Delta t_{i,2}$ of the exposure time period $\Delta t_i$ of the imaging system 404. In some aspects, during the second portion $\Delta t_{i,2}$ of the exposure time period $\Delta t_i$, the radiation system 402 can be configured to irradiate the region 424 of the surface 410a of the reticle 410. For example, during the second portion $\Delta t_{i,2}$ of the exposure time period $\Delta t_i$, the radiation system 402 can transmit a radiation beam 440B toward the region 424 of the surface 410a of the reticle 410 at a third off-axis incident angle. In some aspects, during the second portion $\Delta t_{i,2}$ of the exposure time period $\Delta t_i$, the imaging system 404 can be configured to block (e.g., using a spatial filtering system) radiation 454 reflected from the pattern 410b of the reticle 410. In some aspects, during the second portion $\Delta t_{i,2}$ of the exposure time period $\Delta t_i$, the imaging system 404 can be configured to generate a sub-image of the region 424 based on radiation 444 scattered from the region 424, including from a particle 430, in response to the irradiation of the region 424 by the radiation beam 440B.

In some aspects, during the second portion $\Delta t_{i,2}$ of the exposure time period $\Delta t_i$, the radiation system 402 can be further configured to irradiate a region 464 of the surface 412a of the pellicle 412. For example, during the second portion $\Delta t_{i,2}$ of the exposure time period $\Delta t_i$, the radiation system 402 can transmit a radiation beam 480B toward the region 464 of the surface 412a of the pellicle 412 at a fourth off-axis incident angle. In some aspects, during the second portion $\Delta t_{i,2}$ of the exposure time period $\Delta t_i$, the imaging system 404 can be configured to block (e.g., using a spatial filtering system) radiation 494 reflected from the pattern 410b of the reticle 410. In some aspects, during the second portion $\Delta t_{i,2}$ of the exposure time period $\Delta t_i$, the imaging system 404 can be configured to generate a sub-image of the region 464 based on radiation 484 scattered from the region 464, including from a particle 470, in response to the irradiation of the region 464 by the radiation beam 480B.

Figure 4E:
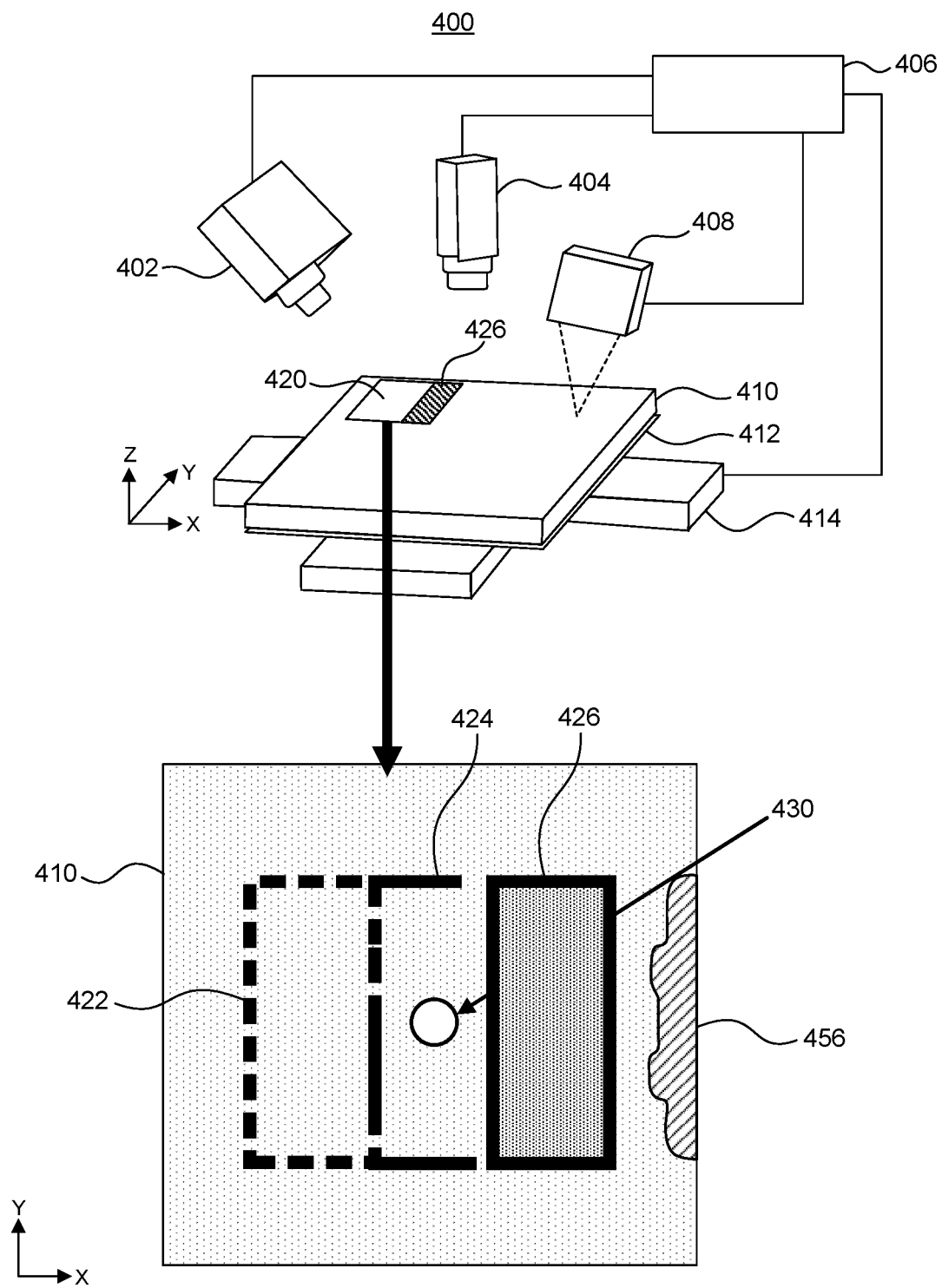
Figure 4F:
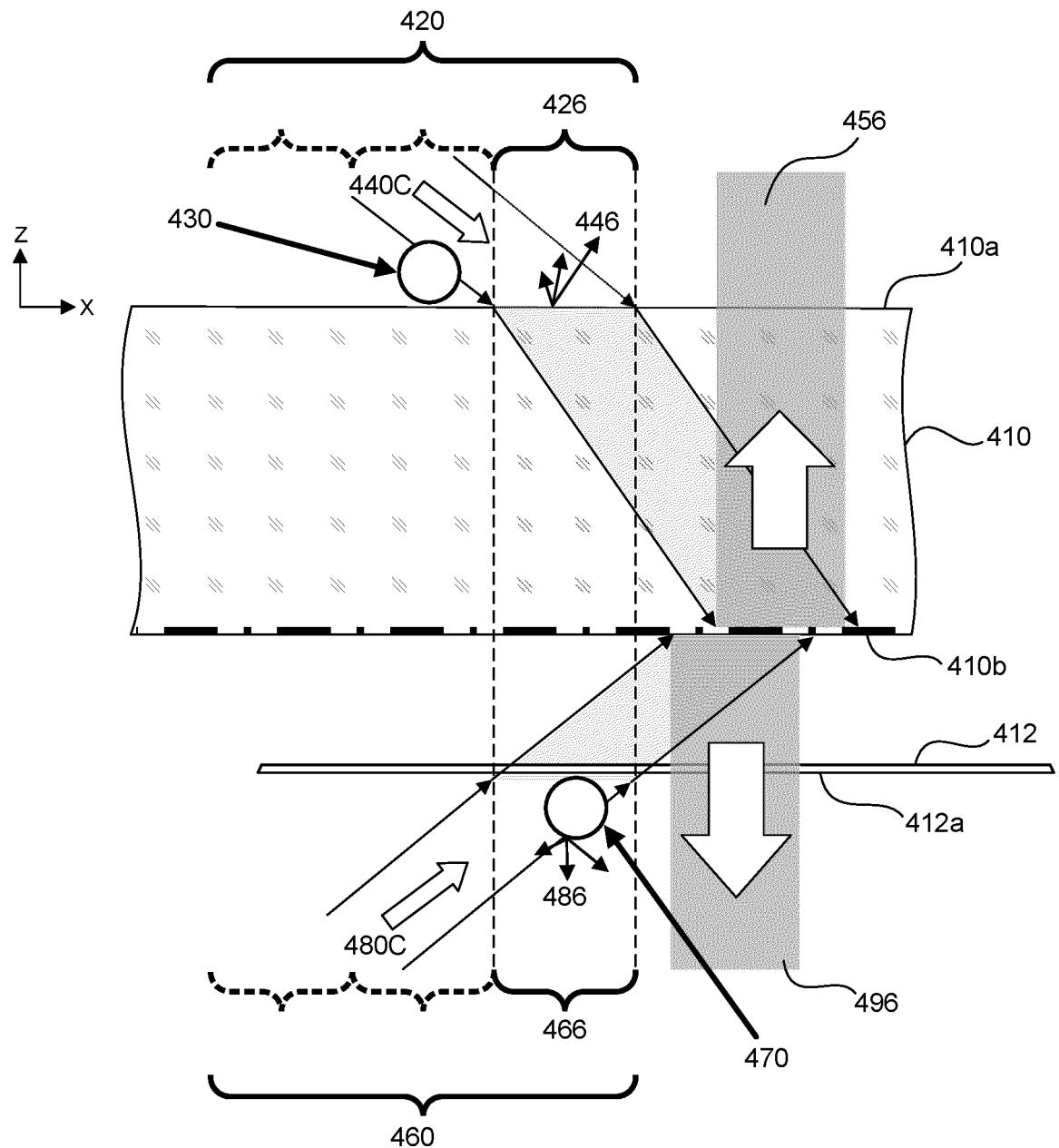

FIGS. 4E and 4F illustrate operations that the example particle inspection system 400 can perform during the third portion $\Delta t_{i,3}$ of the exposure time period $\Delta t_i$, of the imaging system 404. In some aspects, during the third portion $\Delta t_{i,3}$ of the exposure time period $\Delta t_i$, the radiation system 402 can be configured to irradiate the region 426 of the surface 410a of the reticle 410. For example, during the third portion $\Delta t_{i,3}$ of the exposure time period $\Delta t_i$, the radiation system 402 can transmit a radiation beam 440C toward the region 426 of the surface 410a of the reticle 410 at a fifth off-axis incident angle. In some aspects, during the third portion $\Delta t_{i,3}$ of the exposure time period $\Delta t_i$, the imaging system 404 can be configured to block (e.g., using a spatial filtering system) radiation 456 reflected from the pattern 410b of the reticle 410. In some aspects, during the third portion $\Delta t_{i,3}$ of the exposure time period $\Delta t_i$, the imaging system 404 can be configured to generate a sub-image of the region 426 based on radiation 446 scattered from the region 426 in response to the irradiation of the region 426 by the radiation beam 440C.

In some aspects, during the third portion $\Delta t_{i,3}$ of the exposure time period $\Delta t_i$, the radiation system 402 can be further configured to irradiate a region 466 of the surface 412a of the pellicle 412. For example, during the third portion $\Delta t_{i,3}$ of the exposure time period $\Delta t_i$, the radiation system 402 can transmit a radiation beam 480C toward the region 466 of the surface 412a of the pellicle 412 at a sixth off-axis incident angle. In some aspects, during the third portion $\Delta t_{i,3}$ of the exposure time period $\Delta t_i$, the imaging system 404 can be configured to block (e.g., using a spatial filtering system) radiation 496 reflected from the pattern 410b of the reticle 410. In some aspects, during the third portion $\Delta t_{i,3}$ of the exposure time period $\Delta t_i$, the imaging system 404 can be configured to generate a sub-image of the region 466 based on radiation 486 scattered from the region 466 in response to the irradiation of the region 466 by the radiation beam 480C.

In some aspects, the radiation beam 440A can include a first spectrum, the radiation beam 440B can include a second spectrum, and the radiation beam 440C can include a third spectrum. For example, each of the first spectrum, the second spectrum, and the third spectrum can correspond to a white light spectrum or any other suitable spectrum, such as a single-wavelength or multi-wavelength spectrum. In some aspects, the first spectrum, the second spectrum, and the third spectrum can be about equal to each other (e.g., the radiation system 402 can utilize the same spectral band to irradiate different regions). In other aspects, two or more of the first spectrum, the second spectrum, and the third spectrum can be different from each other (e.g., the radiation system 402 can utilize the different spectral channels to irradiate different regions).

In some aspects, the radiation beam 480A can include a fourth spectrum, the radiation beam 480B can include a fifth spectrum, and the radiation beam 480C can include a sixth spectrum. For example, each of the fourth spectrum, the fifth spectrum, and the sixth spectrum can correspond to a white light spectrum or any other suitable spectrum, such as a single-wavelength or multi-wavelength spectrum. In some aspects, the fourth spectrum, the fifth spectrum, and the sixth spectrum can be about equal to each other (e.g., the radiation system 402 can utilize the same spectral band to irradiate different regions). In other aspects, two or more of the fourth spectrum, the fifth spectrum, and the sixth spectrum can be different from each other (e.g., the radiation system 402 can utilize the different spectral channels to irradiate different regions).

In some aspects, the radiation system 402 can include a radiation source configured to generate the radiation beams 440A, 440B, 440C, 480A, 480B, and 480C. In some aspects, the radiation system 402 can include a first radiation source configured to generate the radiation beams 440A, 440B, and 440C, and a second radiation source configured to generate the radiation beams 480A, 480B, and 480C. In some aspects, the radiation system 402 can include multiple radiation sources configured to generate each of the radiation beams 440A, 440B, 440C, 480A, 480B, and 480C.

In some aspects, the radiation system 402 can include a spatial electro-optic modulator configured to generate and transmit the radiation beams 440A, 440B, 440C, 480A, 480B, and 480C. In some aspects, a spatial electro-optic modulator as disclosed herein can include a DMD, an LCM, a spatial light modulator (SLM), or a controllable set of slits configured to be either mechanically exchanged or modified during measurement. In one example, the radiation system 402 can include a radiation source that includes a DMD projection device. In some aspects, the DMD projection device can include a light engine configured to generate radiation beams. In some aspects, the light engine can include three light-emitting diodes (LEDs) (e.g., a red LED, a green LED, and a blue LED) which are sequentially activated to create color images on the imaging device of the imaging system 404. In some aspects, as disclosed herein, the light engine can be modified to use either (i) a combination of LEDs to achieve generation of the spectral signal of interest or (ii) a single LED or light source. In some aspects, the radiation system 402 can utilize either of these techniques to irradiate the sub-regions of the field of view 420 with radiation whose spectral components are controlled. For example, the radiation system 402 can utilize a single light source to illuminate all sub-regions of interest.

In some aspects, the imaging system 404 can be further configured to generate a first composite image corresponding to the field of view 420 based on the sub-image of the region 422, the sub-image of the region 424, and the sub-image of the region 426. In some aspects, as described above with reference to FIGS. 4C and 4D, the region 424 of the surface 410a of the reticle 410 can include the particle 430, and the imaging system 404 can be further configured to detect the particle 430 based on the composite image generated from sub-images of the regions 422, 424, and 426. In some aspects, within the region 424, particle 430 can appear to the imaging system 404 as a bright object on the non-illuminated background of the pattern 410b.

In some aspects, the imaging system 404 can be further configured to generate a second composite image corresponding to the field of view of the surface 412a of the pellicle 412 based on the sub-image of the region 422, the sub-image of the region 424, and the sub-image of the region 426. In some aspects, as further described above with reference to FIGS. 4C and 4D, the region 464 of the surface 412a of the pellicle 412 can include the particle 470, and the imaging system 404 can be further configured to detect the particle 470 based on the composite image generated from sub-images of the regions 462, 464, and 466. In some aspects, within the region 464, particle 470 can appear to the imaging system 404 as a bright object on the non-illuminated background of the pattern 410b.

Figure 5:
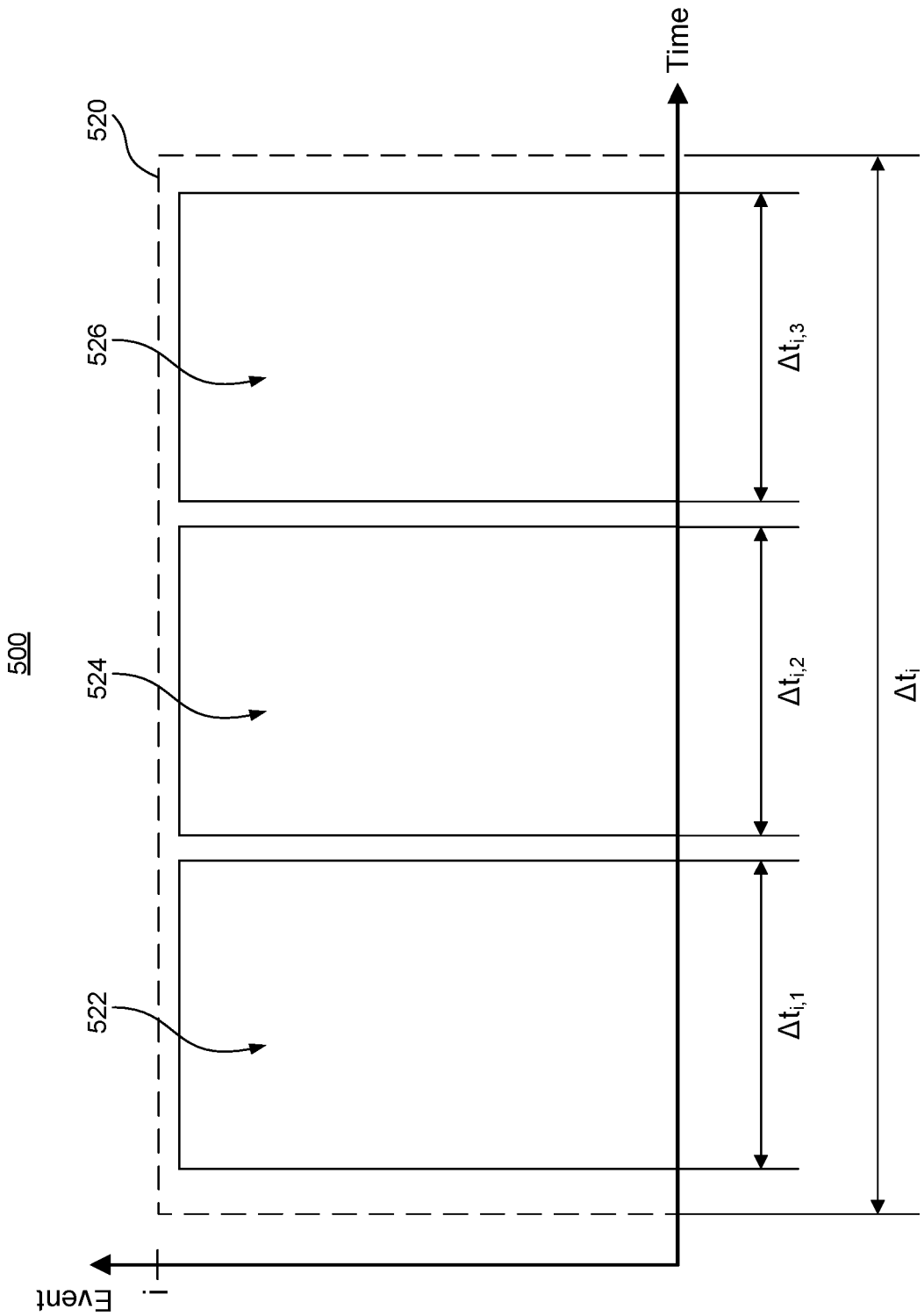
FIG. 5 is an example graph showing imaging events over time according to some aspects of the present disclosure.

FIG. 5 illustrates an example graph 500 showing imaging events over time associated with an imaging system that includes an imaging device according to some aspects of the present disclosure. As shown in FIG. 5, the example graph 500 reflects an ROI illumination-acquisition technique that includes sequentially acquiring, during a single integration cycle of an imaging device, multiple ROI images within a single image frame corresponding to a field of view of the imaging device. In some aspects, the multiple ROI images can include a first ROI sub-image 522, a second ROI sub-image 524, and a third ROI sub-image 526. In some aspects, as shown in FIG. 5, the multiple ROI images can correspond to multiple non-overlapping rectangular regions. In some aspects, the single image frame of the imaging device can include a composite image 520 that includes the first ROI sub-image 522, the second ROI sub-image 524, and the third ROI sub-image 526.

In some aspects, the ROI illumination-acquisition technique of FIG. 5 can include (i) generating the first ROI sub-image 522 based on irradiation and acquisition of a first region of a first surface of a substrate during a first portion $\Delta t_{i,1}$ of an exposure time period $\Delta t_i$ of an imaging device, (ii) generating the second ROI sub-image 524 based on irradiation and acquisition of a second region of the first surface of the substrate during a second portion $\Delta t_{i,2}$ of the exposure time period $\Delta t_i$, and (iii) generating the third ROI sub-image 526 based on irradiation and acquisition of a third region of the first surface of the substrate during a third portion $\Delta t_{i,3}$ of the exposure time period $\Delta t_i$, where the subscript "i" is an integer value denoting the i-th exposure time period of the imaging device and the subscripts "1," "2," and "3" denote the first, second, and third portions of the i-th exposure time period, respectively.

In some aspects, the ROI illumination-acquisition technique of FIG. 5 can include blocking, by a spatial electro-optic modulator included in the imaging system, radiation reflected from a second surface of the substrate disposed opposite the first surface of the substrate during the exposure time of the imaging device. For example, during the first portion of the exposure time period, the ROI illumination-acquisition technique of FIG. 5 can include blocking radiation reflected from outside the first region by deactivating or switching off all reflective elements (e.g., micro-mirrors, liquid crystals) of the spatial electro-optic modulator that do not correspond to radiation reflected from the first region during the first portion of the exposure time period, while reflective elements of the spatial electro-optic modulator that correspond to radiation reflected from the first region are active or switched on during the first portion of the exposure time period. During the second portion of the exposure time period, the ROI illumination-acquisition technique of FIG. 5 can further include blocking radiation reflected from outside the second region by deactivating or switching off all reflective elements of the spatial electro-optic modulator that do not correspond to radiation reflected from the second region during the second portion of the exposure time period, while reflective elements of the spatial electro-optic modulator that correspond to radiation reflected from the second region are active or switched on during the second portion of the exposure time period. During the third portion of the exposure time period, the ROI illumination-acquisition technique of FIG. 5 can further include blocking radiation reflected from outside the third region by deactivating or switching off all reflective elements of the spatial electro-optic modulator that do not correspond to radiation reflected from the third region during the third portion of the exposure time period, while reflective elements of the spatial electro-optic modulator that correspond to radiation reflected from the third region are active or switched on during the third portion of the exposure time period.

In some aspects, the ROI illumination-acquisition technique of FIG. 5 can further include storing each of the multiple ROI images in a different sub-frame of the single image frame. For example, where the single image frame includes a red page, a green page, and a blue page, the ROI illumination-acquisition technique of FIG. 5 can include storing the first ROI sub-image 522 in the red page of the single image frame, storing the second ROI sub-image 524 in the green page of the single image frame, and storing the third ROI sub-image 526 in the blue page of the single image frame. In some aspects, the ROI illumination-acquisition technique of FIG. 5 can further include generating the composite image 520 based on the first ROI sub-image 522, the second ROI sub-image 524, and the third ROI sub-image 526.

Figure 6A:
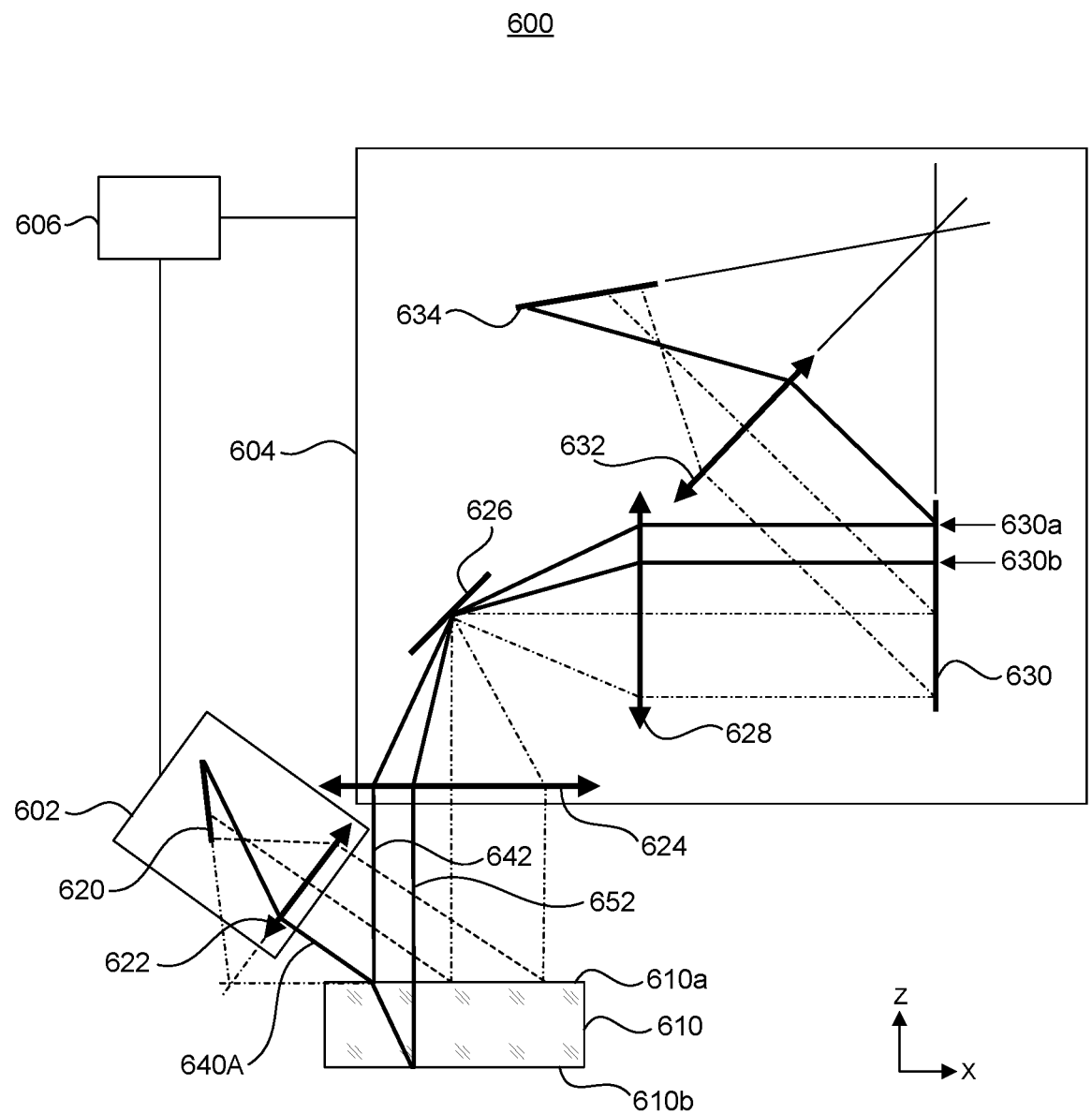
FIGS. 6A, 6B, and 6C are schematic illustrations of an example particle inspection system using two spatial electro-optic modulators according to some aspects of the present disclosure.
Figure 6B:
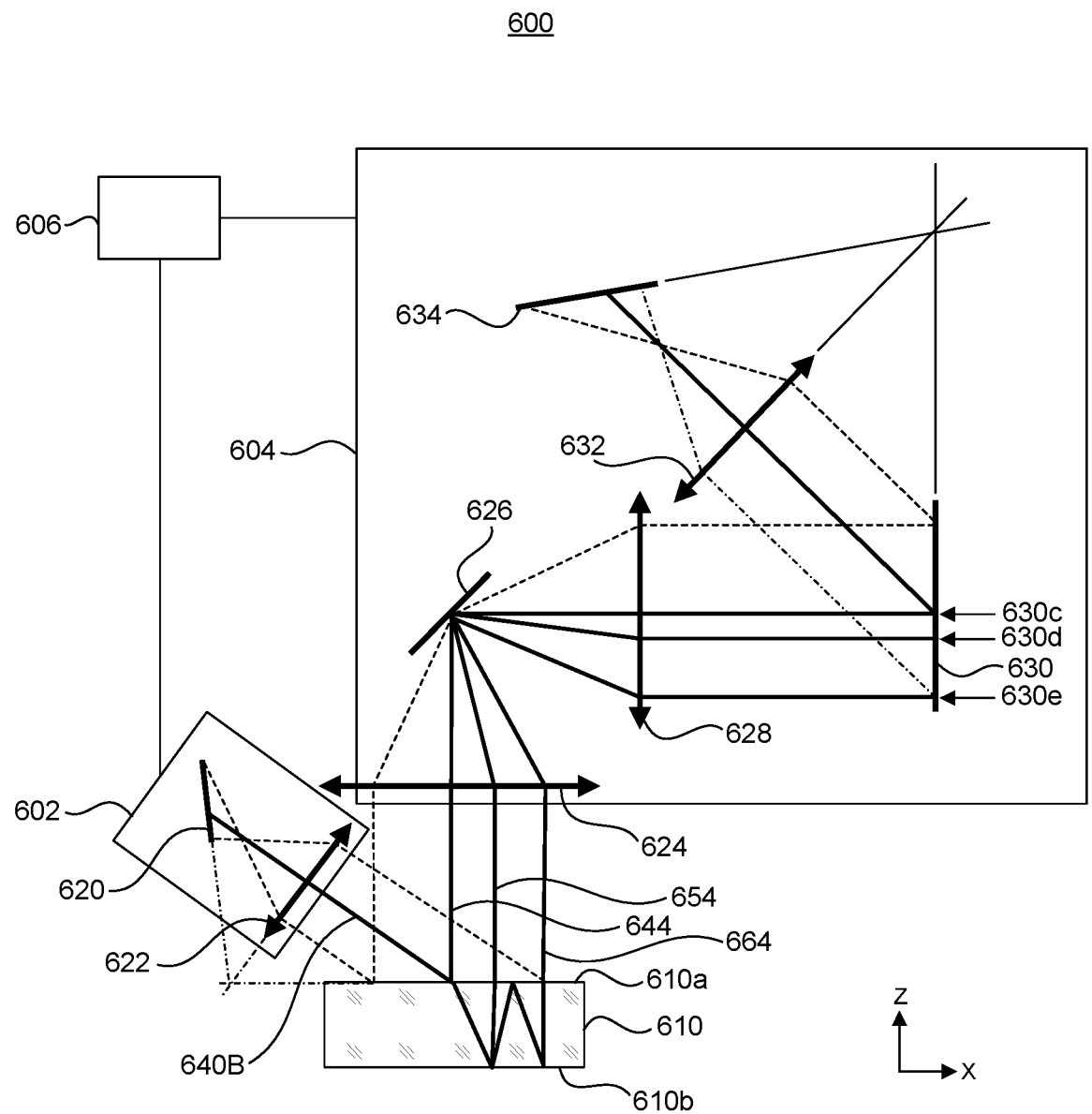
Figure 6C:
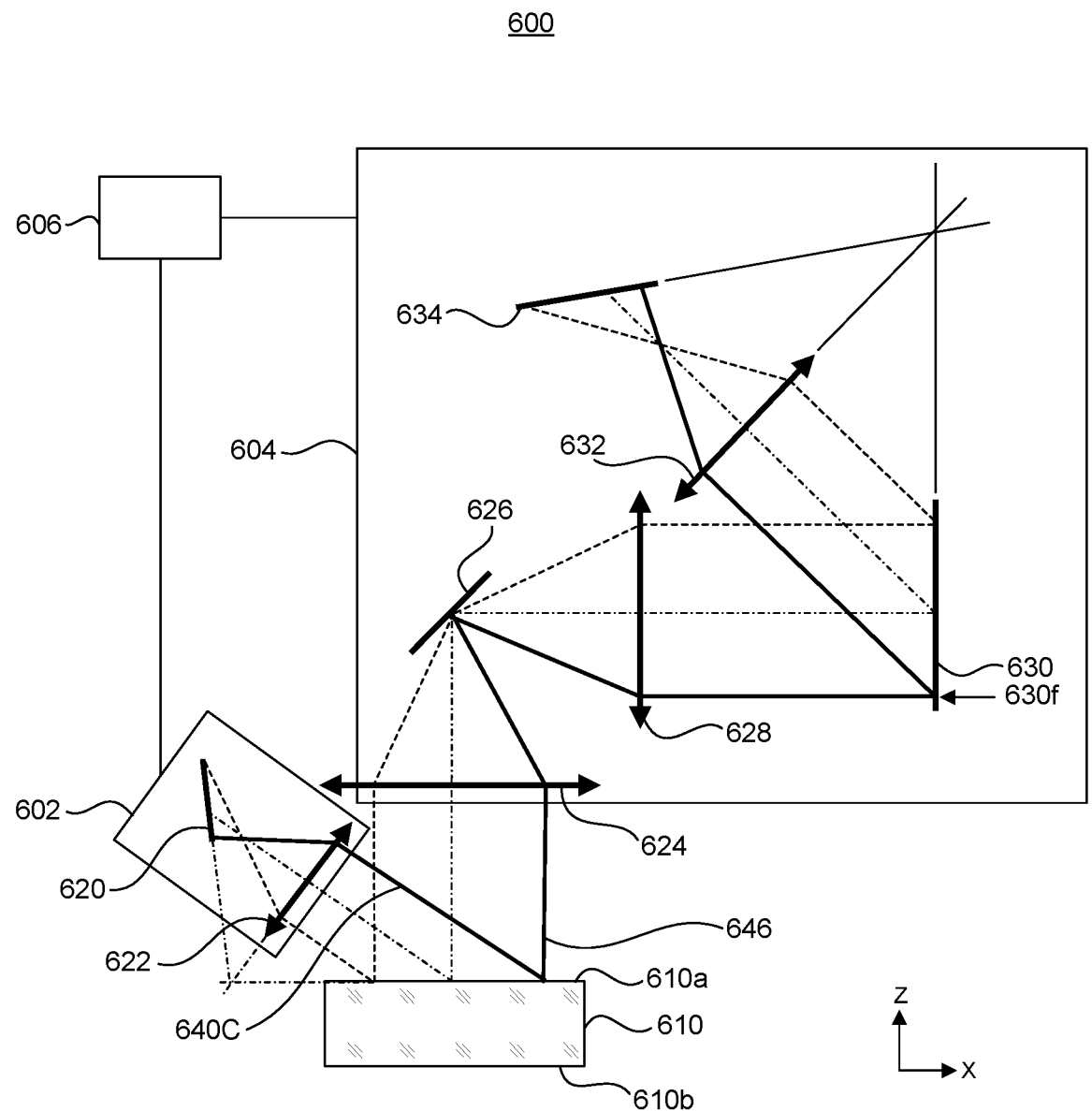

FIGS. 6A, 6B, and 6C are schematic illustrations of an example particle inspection system 600 (e.g., a synchronized double-scan ROI illumination-acquisition system) that utilizes two spatial electro-optic modulators (e.g., in either a scanning imaging mode or a stepping imaging mode) according to some aspects of the present disclosure. The example particle inspection system 600 can include a radiation system 602, an imaging system 604, and a particle inspection controller 606 (e.g., example computing system 1100 described with reference to FIG. 11). The example particle inspection system 600 can be configured to inspect a surface 610a of a reticle 610 for contamination. For example, the example particle inspection system 600 can be configured to scan or step the surface 610a of the reticle 610 in point mode, line mode, or area mode. In some aspects, the reticle 610 can be placed on an XYZ stage (not shown) whose position is controllable by one or more electro-mechanical actuators communicatively coupled to the particle inspection controller 606. In some aspects, as described herein, the example particle inspection system 600 can be configured to detect particles disposed on the surface 610a of the reticle 610 at an increased throughput and bandwidth utilization without detecting false positives due to radiation reflected from a pattern 610b of the reticle 610.

In some aspects, the radiation system 602 can include a first spatial electro-optic modulator 620 (e.g., a first DMD, LCM, SLM, or controllable set of slits configured to be either mechanically exchanged or modified during measurement) and an optic 622 (e.g., a lens). In some aspects, the imaging system 604 can include a spatial filtering system and an imaging device 634 (e.g., a CMOS or CCD detector). In some aspects, the spatial filtering system can include an optic 624 (e.g., a lens), an optic 626 (e.g., a folding mirror), an optic 628 (e.g., a re-imaging lens), a second spatial electro-optic modulator 630 (e.g., a second DMD, LCM, SLM, or controllable set of slits configured to be either mechanically exchanged or modified during measurement), and an optic 632 (e.g., a lens). In some aspects, the second spatial electro-optic modulator 630 can include reflective elements (e.g., micro-mirrors, liquid crystals) configured to reflect or block radiation received from the surface 610a of the reticle 610. In some aspects, the second spatial electro-optic modulator 630 can be configured to act as a spatial filter that passes reflected or scattered radiation originating from a presently-irradiated region of the object under test. In other words, the second spatial electro-optic modulator 630 can be configured to block radiation which does not come from the current ROI.

In some aspects, in order to maximize throughput, the radiation system 602 can irradiate the area equivalent to the maximum possible ROI determined according to opto-mechanical characteristics (e.g., which can be driven by the numerical aperture (NA) of the radiation system 602 and the imaging system 604 together with the projection angle of the radiation beam 640 and the refractive index of the reticle 610). In addition, because spatial electro-optical modulators can operate with frequencies orders of magnitude faster than full-field cameras of modest resolution, it is possible to capture multiple ROIs using the double-scanning techniques of FIGS. 6A, 6B, and 6C during a single integration event of the imaging device 634. In some aspects, the imaging device 634 can be operated in either rolling shutter mode (e.g., line illumination) or in global shutter mode (e.g., point and area illumination).

As shown in FIG. 6A, in some aspects, the first spatial electro-optic modulator 620 can be configured to transmit, during a first portion of an exposure time period of the imaging device 634, a radiation beam 640A through the optic 622 toward a first region of the surface 610a of the reticle 610. In some aspects, during the first portion of the exposure time period, the second spatial electro-optic modulator 630 can be configured to reflect radiation 642 (e.g., radiation received from the first region) toward the imaging device 634 by switching on reflective elements 630a. In some aspects, during the first portion of the exposure time period, the second spatial electro-optic modulator 630 can be configured to block radiation 652 (e.g., radiation reflected off of the pattern 610b and received from outside the first region) from being reflected or otherwise transmitted toward the imaging device 634 by switching off reflective elements 630b. In some aspects, during the first portion of the exposure time period, the imaging device 634 can be configured to capture the radiation 642 and generate a first ROI sub-image based thereon.

As shown in FIG. 6B, in some aspects, the first spatial electro-optic modulator 620 can be configured to transmit, during a second portion of the exposure time period of the imaging device 634, a radiation beam 640B through the optic 622 toward a second region of the surface 610a of the reticle 610. In some aspects, during the second portion of the exposure time period, the second spatial electro-optic modulator 630 can be configured to reflect radiation 644 (e.g., radiation received from the second region) toward the imaging device 634 by switching on reflective elements 630c. In some aspects, during the second portion of the exposure time period, the second spatial electro-optic modulator 630 can be configured to block radiation 654 and radiation 664 (e.g., radiation reflected off of the pattern 610b and received from outside the second region) from being reflected or otherwise transmitted toward the imaging device 634 by switching off reflective elements 630d and reflective elements 630e, respectively. In some aspects, during the second portion of the exposure time period, the imaging device 634 can be configured to capture the radiation 644 and generate a second ROI sub-image based thereon.

As shown in FIG. 6C, in some aspects, the first spatial electro-optic modulator 620 can be configured to transmit, during a third portion of the exposure time period of the imaging device 634, a radiation beam 640C through the optic 622 toward a third region of the surface 610a of the reticle 610. In some aspects, during the third portion of the exposure time period, the second spatial electro-optic modulator 630 can be configured to reflect radiation 646 (e.g., radiation received from the third region) toward the imaging device 634 by switching on reflective elements 630f. In some aspects, during the third portion of the exposure time period, the imaging device 634 can be configured to capture the radiation 646 and generate a third ROI sub-image based thereon.

In some aspects, the imaging system 604 can be configured to generate, during the exposure time period, a composite image corresponding to the field of view of the imaging device 634. For example, during the exposure time period, the imaging system 604 can be configured to generate a composite image based on the first ROI sub-image, the second ROI sub-image, and the third ROI sub-image.

Figure 7A:
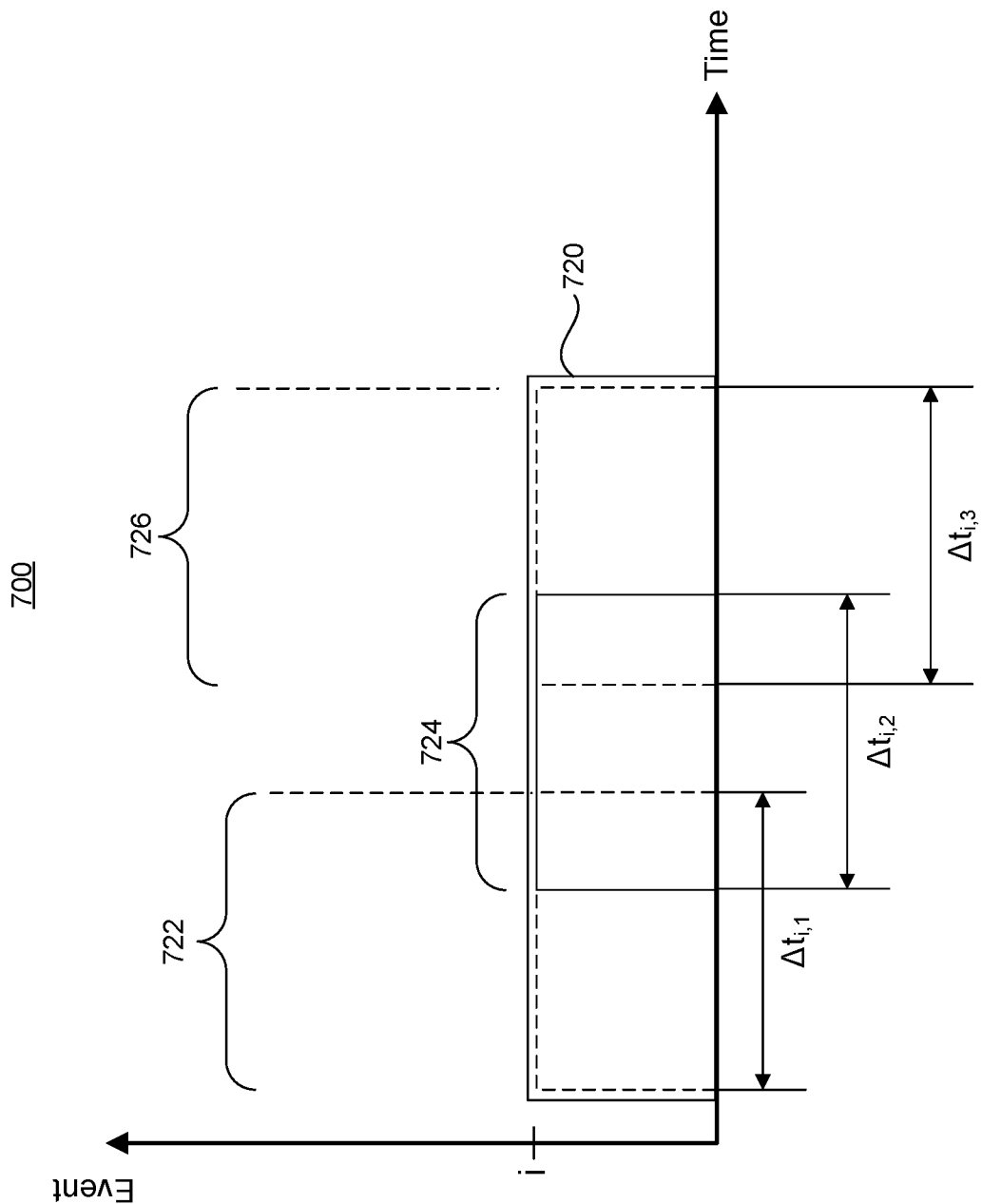
FIGS. 7A and 7B are an example graph and a schematic illustration of an example imaging system using a rolling shutter acquisition mode according to some aspects of the present disclosure.

FIG. 7A illustrates an example graph 700 showing imaging events over time associated with an imaging system that utilizes a rolling shutter acquisition mode of an imaging device according to some aspects of the present disclosure. As shown in FIG. 7, the example graph 700 reflects an ROI illumination-acquisition technique that includes sequentially acquiring, during a single integration cycle of the imaging system, multiple actively-exposed rows of the imaging device within a single image frame corresponding to a field of view of the imaging device. In some aspects, the multiple actively-exposed rows of the imaging device can include a first sub-image 722 corresponding to a first actively-exposed row of the imaging device, a second sub-image 724 corresponding to a second actively-exposed row of the imaging device, and a third sub-image 726 corresponding to a third actively-exposed row of the imaging device. In some aspects, the single image frame of the imaging device can include a composite image 720 that includes the first sub-image 722, the second sub-image 724, and the third sub-image 726.

In some aspects, the ROI illumination-acquisition technique of FIG. 7A can include (i) generating the first sub-image 722 by exposing, during a first portion $\Delta t_{i,1}$ of an exposure time period $\Delta t_i$ of the imaging device, a first row of the imaging device that corresponds to an irradiated first region of a first surface of a substrate, (ii) generating the second sub-image 724 by exposing, during a second portion $\Delta t_{i,2}$ of the exposure time period $\Delta t_i$ of the imaging device, a second row of the imaging device that corresponds to an irradiated second region of the first surface of the substrate, and (iii) generating the third sub-image 726 by exposing, during a third portion $\Delta t_{i,3}$ of the exposure time period $\Delta t_i$ of the imaging device, a third row of the imaging device that corresponds to an irradiated third region of the first surface of the substrate, where the subscript "i" is an integer value denoting the i-th exposure time period of the imaging device and the subscripts "1," "2," and "3" denote the first, second, and third portions of the i-th exposure time period, respectively. In some aspects, the ROI illumination-acquisition technique of FIG. 7A can further include generating the composite image 720 based on the first sub-image 722, the second sub-image 724, and the third sub-image 726.

In some aspects, the ROI illumination-acquisition technique of FIG. 7A can include blocking radiation reflected from a second surface of the substrate disposed opposite the first surface of the substrate during the exposure time of the imaging device. For example, during the first portion of the exposure time period, the ROI illumination-acquisition technique of FIG. 7A can include blocking radiation reflected from outside the first region by deactivating or otherwise not exposing all rows that are not adjacent to the first row (e.g., all rows other than the second row and, if applicable, a zeroth row (not shown)) during the first portion of the exposure time period, while the first row is actively exposed during the first portion of the exposure time period, and rows adjacent to the first row (e.g., the second row and, if applicable, a zeroth row (not shown)) are actively exposed during at least a respective sub-portion of the first portion of the exposure time period. During the second portion of the exposure time period, the ROI illumination-acquisition technique of FIG. 7A can further include blocking radiation reflected from outside the second region by deactivating or otherwise not exposing all rows that are not adjacent to the second row (e.g., all rows other than the second row and the third row) during the second portion of the exposure time period, while the second row is actively exposed during the second portion of the exposure time period, and rows adjacent to the second row (e.g., the first row and the third row) are actively exposed during at least a respective sub-portion of the second portion of the exposure time period. During the third portion of the exposure time period, the ROI illumination-acquisition technique of FIG. 7A can further include blocking radiation reflected from outside the third region by deactivating or otherwise not exposing all rows that are not adjacent to the third row (e.g., all rows other than the third row and, if applicable, a fourth row (not shown)) during the second portion of the exposure time period, while the third row is actively exposed during the third portion of the exposure time period, and rows adjacent to the third row (e.g., the third row and, if applicable, a fourth row (not shown)) are actively exposed during at least a respective sub-portion of the third portion of the exposure time period.

Figure 7B:
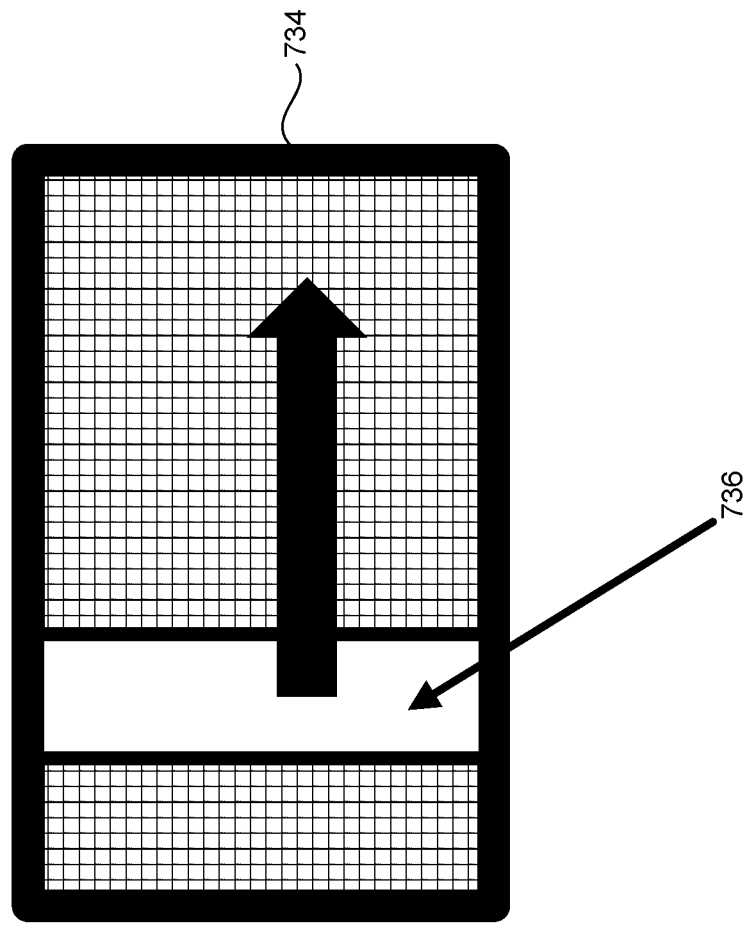

FIG. 7B illustrates an example imaging system 704 using a rolling shutter acquisition mode according to some aspects of the present disclosure. As shown in FIG. 7B, the example imaging system 704 can include an imaging device 734

(e.g., a CMOS or CCD detector) and an actively exposed row 736 that can scan or "roll" across the detection surface of the imaging device 734 while in rolling shutter acquisition mode.

Figure 8A:
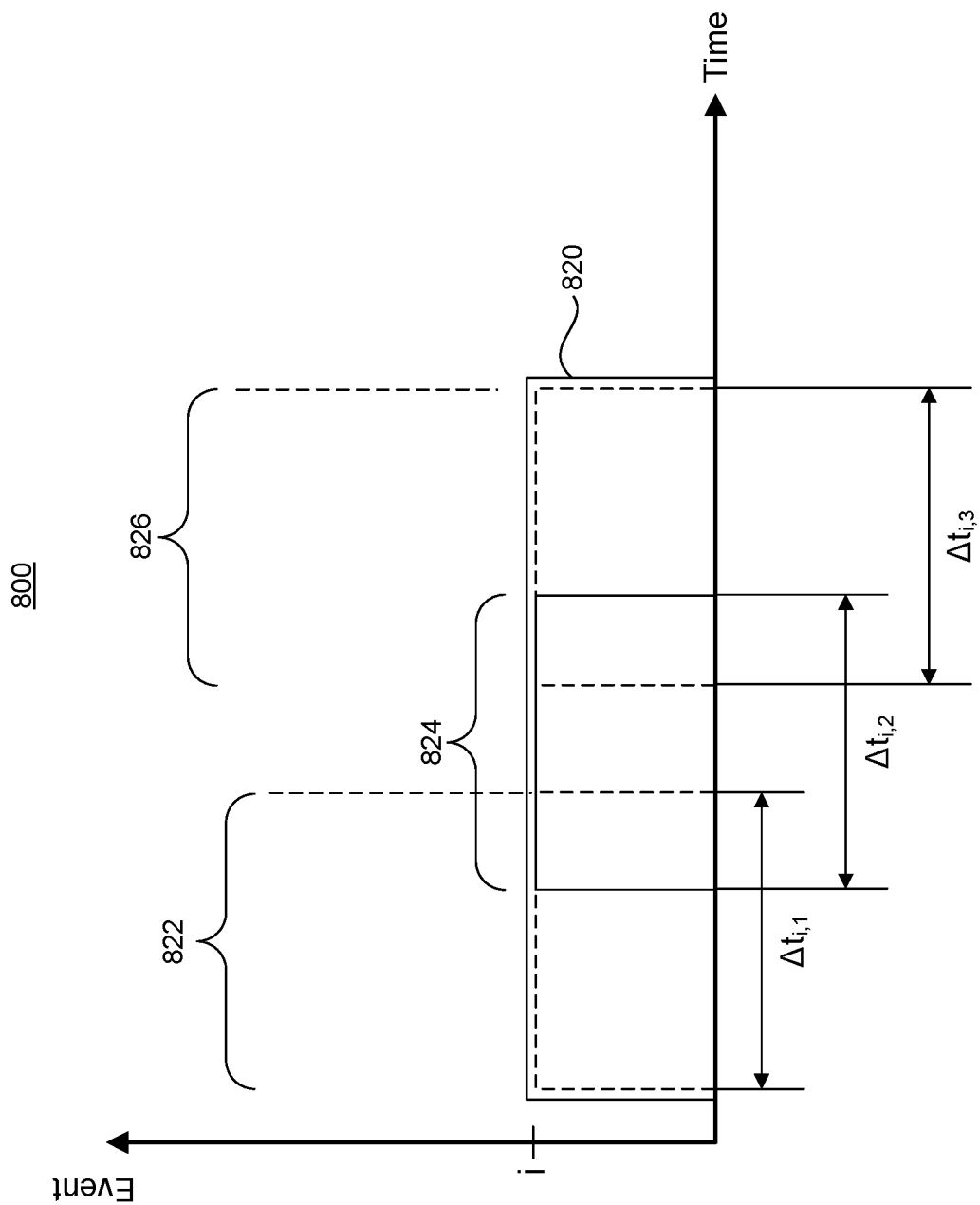
FIGS. 8A and 8B are an example graph and a schematic illustration of an example imaging using an ROI acquisition mode according to some aspects of the present disclosure.

FIG. 8A illustrates an example graph 800 showing imaging events over time associated with an imaging system that utilizes an ROI acquisition mode of an imaging device according to some aspects of the present disclosure. As shown in FIG. 8, the example graph 800 reflects an ROI illumination-acquisition technique that includes sequentially acquiring, during a single integration cycle of the imaging system, multiple actively-exposed areas of the imaging device within a single image frame corresponding to a field of view of the imaging device. In some aspects, the multiple actively-exposed areas of the imaging device can include a first sub-image 822 corresponding to a first actively-exposed area of the imaging device, a second sub-image 824 corresponding to a second actively-exposed area of the imaging device, and a third sub-image 826 corresponding to a third actively-exposed area of the imaging device. In some aspects, the single image frame of the imaging device can include a composite image 820 that includes the first sub-image 822, the second sub-image 824, and the third sub-image 826. In some aspects, the actively-exposed area of the imaging device can be defined on the fly with substantially no lag time.

In some aspects, the ROI illumination-acquisition technique of FIG. 8A can include (i) generating the first sub-image 822 by exposing, during a first portion $\Delta t_{i,1}$ of an exposure time period $\Delta t_i$ of the imaging device, a first area of the imaging device that corresponds to an irradiated first region of a first surface of a substrate, (ii) generating the second sub-image 824 by exposing, during a second portion $\Delta t_{i,2}$ of the exposure time period $\Delta t_i$ of the imaging device, a second area of the imaging device that corresponds to an irradiated second region of the first surface of the substrate, and (iii) generating the third sub-image 826 by exposing, during a third portion $\Delta t_{i,3}$ of the exposure time period $\Delta t_i$ of the imaging device, a third area of the imaging device that corresponds to an irradiated third region of the first surface of the substrate, where the subscript "i" is an integer value denoting the i-th exposure time period of the imaging device and the subscripts "1," "2," and "3" denote the first, second, and third portions of the i-th exposure time period, respectively. In some aspects, the ROI illumination-acquisition technique of FIG. 8A can further include generating the composite image 820 based on the first sub-image 822, the second sub-image 824, and the third sub-image 826.

In some aspects, the ROI illumination-acquisition technique of FIG. 8A can include blocking radiation reflected from a second surface of the substrate disposed opposite the first surface of the substrate during the exposure time of the imaging device. For example, during the first portion of the exposure time period, the ROI illumination-acquisition technique of FIG. 8A can include blocking radiation reflected from outside the first region by deactivating or otherwise not exposing all areas that are not adjacent to the first area (e.g., all areas other than the second area and, if applicable, a zeroth area (not shown)) during the first portion of the exposure time period, while the first area is actively exposed during the first portion of the exposure time period, and areas adjacent to the first area (e.g., the second area and, if applicable, a zeroth area (not shown)) are actively exposed during at least a respective sub-portion of the first portion of the exposure time period. During the second portion of the exposure time period, the ROI illumination-acquisition technique of FIG. 8A can further include blocking radiation reflected from outside the second region by deactivating or otherwise not exposing all areas that are not adjacent to the second area (e.g., all areas other than the second area and the third area) during the second portion of the exposure time period, while the second area is actively exposed during the second portion of the exposure time period, and areas adjacent to the second area (e.g., the first area and the third area) are actively exposed during at least a respective sub-portion of the second portion of the exposure time period. During the third portion of the exposure time period, the ROI illumination-acquisition technique of FIG. 8A can further include blocking radiation reflected from outside the third region by deactivating or otherwise not exposing all areas that are not adjacent to the third area (e.g., all areas other than the third area and, if applicable, a fourth area (not shown)) during the second portion of the exposure time period, while the third area is actively exposed during the third portion of the exposure time period, and areas adjacent to the third area (e.g., the third area and, if applicable, a fourth area (not shown)) are actively exposed during at least a respective sub-portion of the third portion of the exposure time period.

Figure 8B:
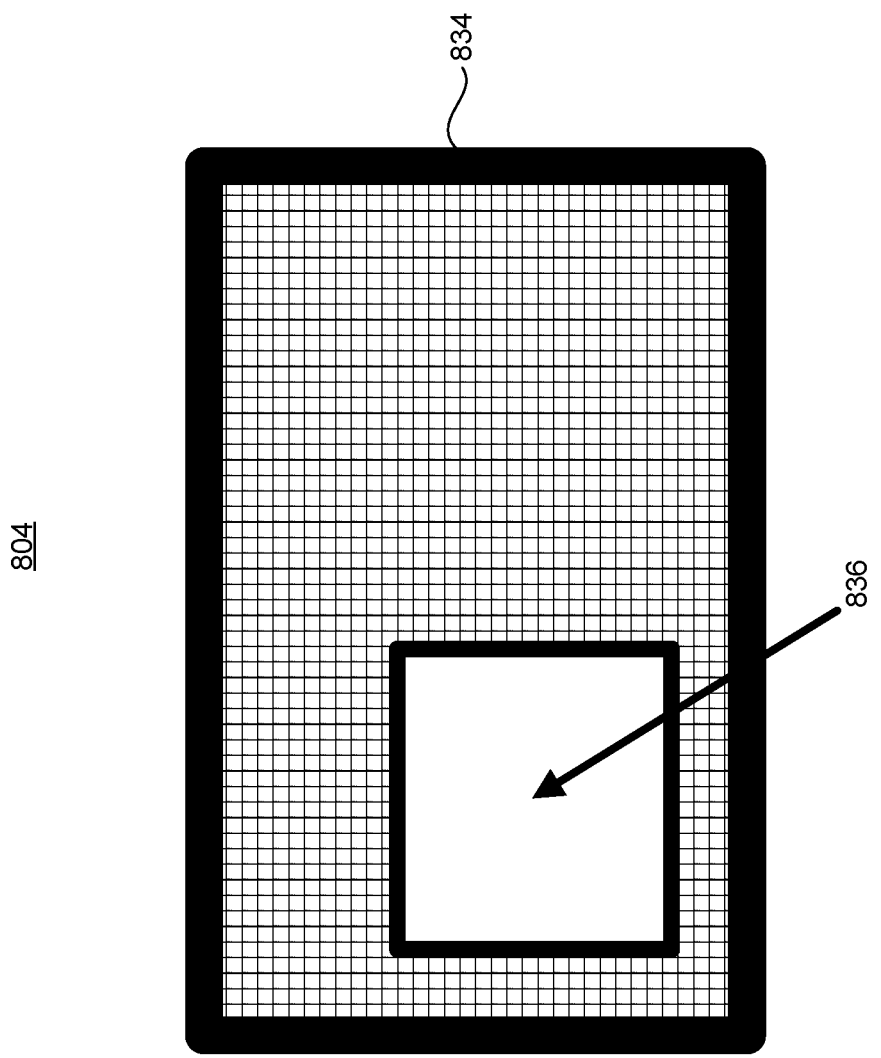

FIG. 8B illustrates an example imaging system 804 using an ROI acquisition mode according to some aspects of the present disclosure. As shown in FIG. 8B, the example imaging system 804 can include an imaging device 834 (e.g., a CMOS or CCD detector) and an actively exposed area 836 that can step or move across the detection surface of the imaging device 834 while in ROI acquisition mode.

Figure 9A:
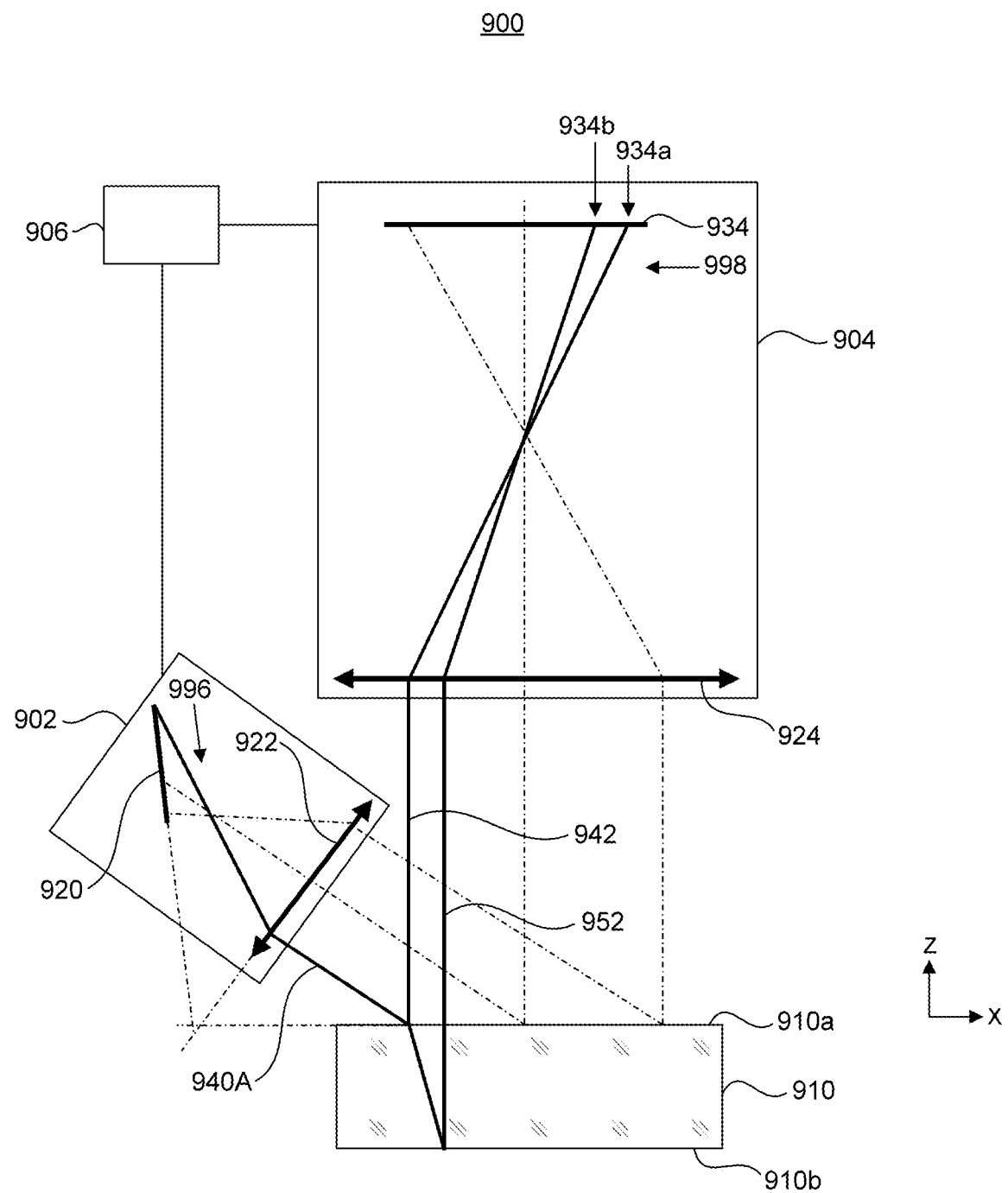
FIGS. 9A, 9B, and 9C are schematic illustrations of an example particle inspection system including an example imaging system configured to utilize a rolling shutter acquisition mode or an ROI acquisition mode according to some aspects of the present disclosure.
Figure 9B:
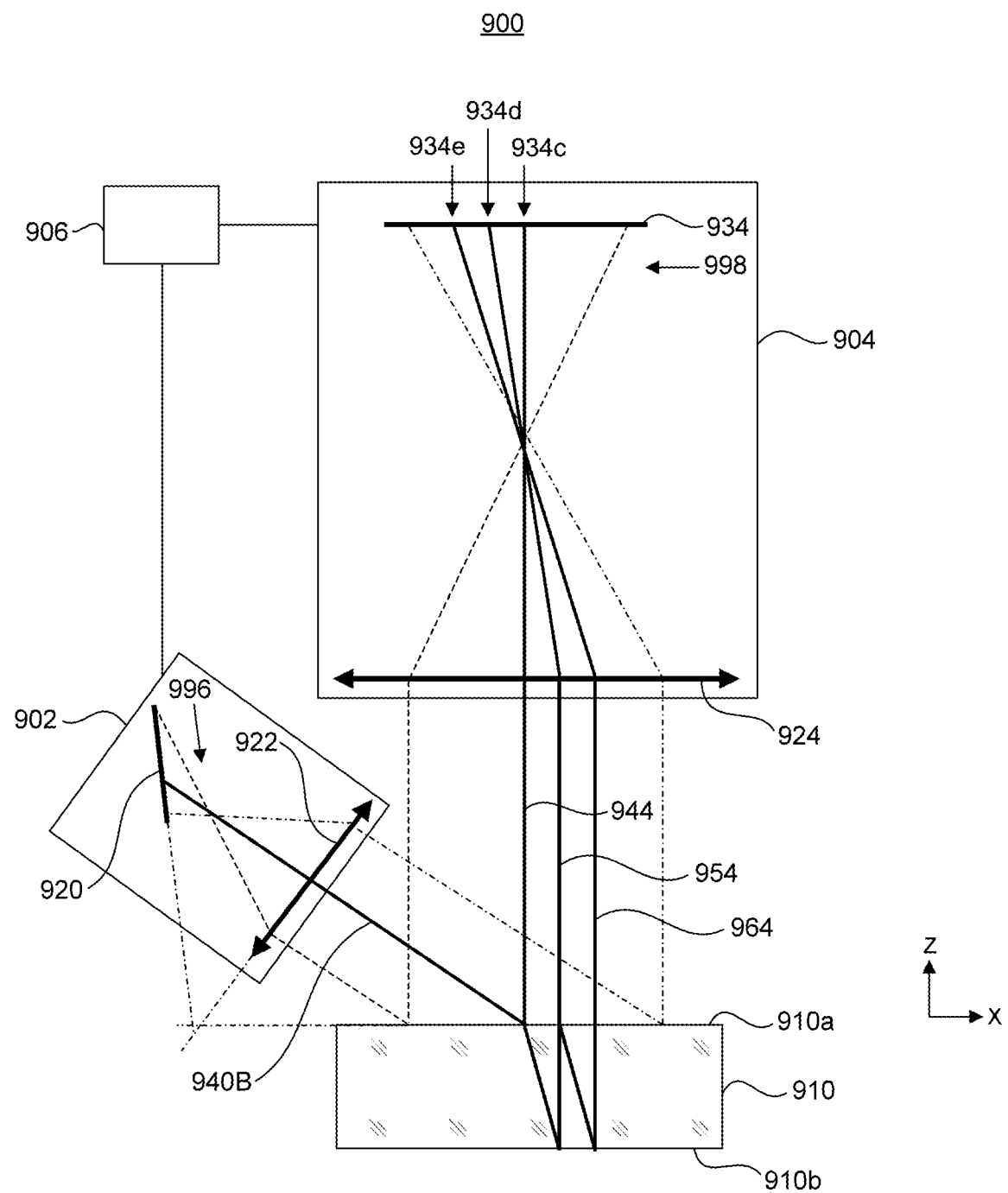
Figure 9C:
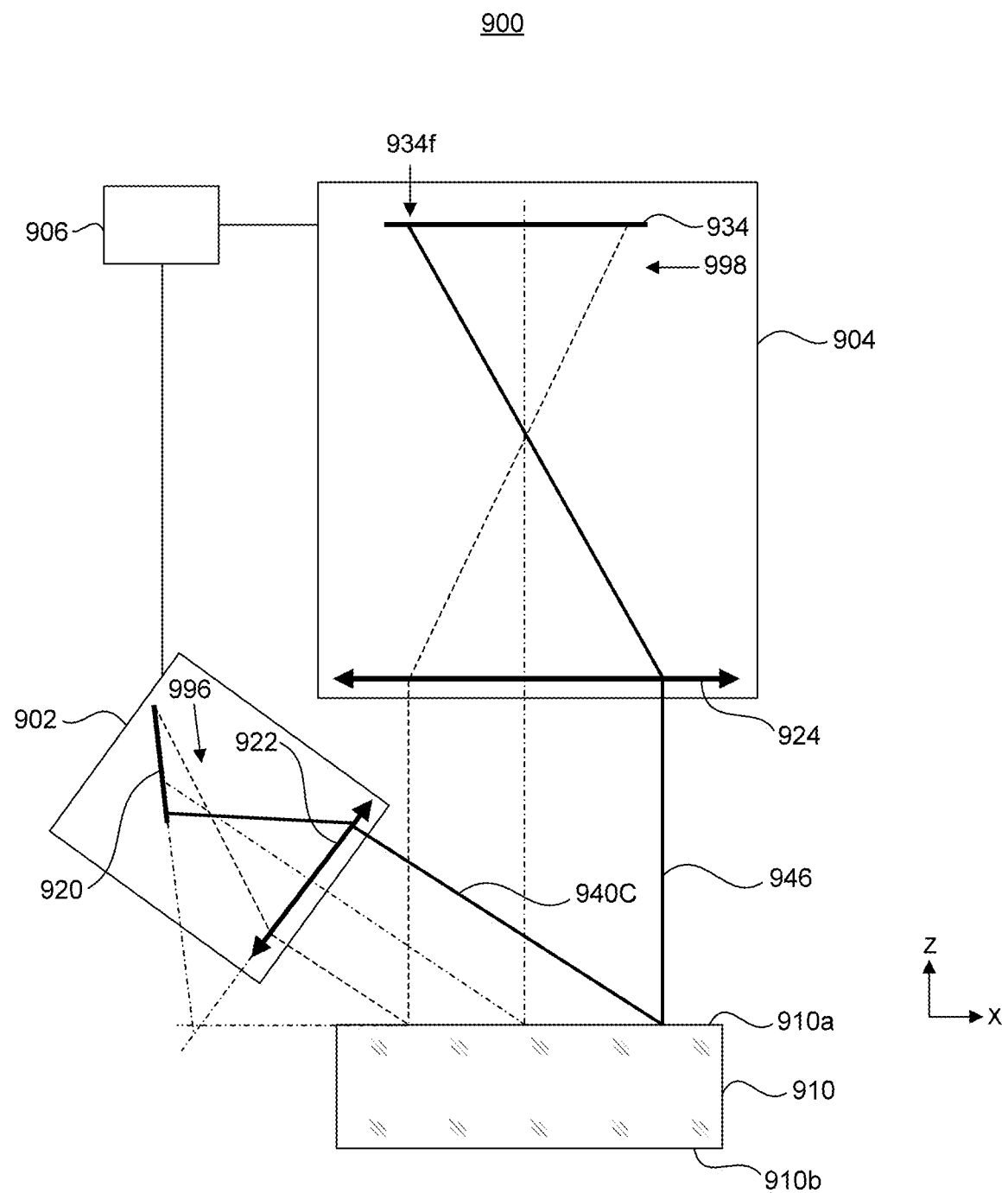

FIGS. 9A, 9B, and 9C are schematic illustrations of an example particle inspection system 900 including an example imaging system 904 configured to utilize a rolling shutter acquisition mode or an ROI acquisition mode according to some aspects of the present disclosure. The example particle inspection system 900 can include a radiation system 902, an imaging system 904, and a particle inspection controller 906 (e.g., example computing system 1100 described with reference to FIG. 11). The example particle inspection system 900 can be configured to inspect a surface 910a of a reticle 910 for contamination. In some aspects, the reticle 910 can be placed on an XYZ stage (not shown) whose position is controllable by one or more electro-mechanical actuators communicatively coupled to the particle inspection controller 906. In some aspects, as described herein, the example particle inspection system 900 can be configured to detect particles disposed on the surface 910a of the reticle 910 at an increased throughput and bandwidth utilization without detecting false positives due to radiation reflected from a pattern 910b of the reticle 910.

In some aspects, the radiation system 902 can include a spatial electro-optic modulator 920 (e.g., a DMD, LCM, SLM, or controllable set of slits configured to be either mechanically exchanged or modified during measurement) and an optic 922 (e.g., a lens). In some aspects, the imaging system 904 can include an optic 924 (e.g., a lens) and a spatial filtering system that includes an imaging device 934 (e.g., a CMOS or CCD detector) implemented in either rolling shutter acquisition mode or ROI acquisition mode. In some aspects, the spatial filtering system can be configured to block radiation reflected from the pattern 910b of the reticle 910 using, for example, a rolling shutter acquisition mode of the imaging device 934 (e.g., as described with reference to FIGS. 7A and 7B), an ROI acquisition mode of the imaging device 934 (e.g., as described with reference to FIGS. 8A and 8B), or any other suitable technique.

In some aspects, the radiation system 902 can sequentially irradiate adjacent regions of the surface 910a of the reticle

910 by scanning a radiation beam or slit in, for example, one direction with substantially constant speed. In some aspects, the scan direction of the radiation system 902 can be indicated by downward-facing arrow 996.

In some aspects, the pixels of the imaging device 934 can be activated in a "rolling shutter" acquisition mode (e.g., a scanning imaging mode) or an "ROI" acquisition mode (e.g., a stepping imaging mode), in such a way that active pixels corresponding to the irradiated region of the surface 910a of the reticle 910 under test collect radiation reflected or scattered from the irradiated region and inactive pixels corresponding to non-irradiated regions block radiation reflected or scattered from those non-irradiated regions (e.g., including radiation reflected off of the pattern 910b). In other words, for any given time period, only pixels that correspond to the region irradiated during that time period can actively accumulate radiation. In some aspects, the step or movement direction of the imaging device 934 can be indicated by left-facing arrow 998.

In some aspects, the spatial filtering system can be implemented based on a rolling shutter acquisition mode of the imaging device 934. For example, the first region can define a first line corresponding to a first actively-exposed row of the imaging device 934, and the second region can define a second line different from the first line corresponding to a second actively-exposed row of the imaging device 934. In other aspects, the spatial filtering system can be implemented based on an ROI acquisition mode of the imaging device 934. For example, the first region can define a first rectangular area corresponding to a first actively-exposed area of the imaging device 934, and the second region can define a second rectangular area corresponding to a second actively-exposed area of the imaging device 934.

As shown in FIG. 9A, in some aspects, the spatial electro-optic modulator 920 can be configured to transmit, during a first portion of an exposure time period of the imaging device 934, a radiation beam 940A through the optic 922 toward a first region of the surface 910a of the reticle 910. In some aspects, during the first portion of the exposure time period, the imaging device 934 can be configured to capture radiation 942 (e.g., radiation received from the first region) using a first actively-exposed row or area of the imaging device 934. In some aspects, during the first portion of the exposure time period, the imaging device 934 can be configured to block radiation 952 (e.g., "ghost" radiation reflected off of the pattern 910b and received from outside the first region) by deactivating or otherwise not exposing, during the second portion of the exposure time period, all rows or areas that are not adjacent to the first actively-exposed row or area. In some aspects, during the first portion of the exposure time period, the imaging device 934 can be configured to capture the radiation 942 and generate a first ROI sub-image based thereon.

As shown in FIG. 9B, in some aspects, the spatial electro-optic modulator 920 can be configured to transmit, during a second portion of the exposure time period of the imaging device 934, a radiation beam 940B through the optic 922 toward a second region of the surface 910a of the reticle 910. In some aspects, during the second portion of the exposure time period, the imaging device 934 can be configured to capture radiation 944 (e.g., radiation received from the second region) using a second actively-exposed row or area of the imaging device 934. In some aspects, during the second portion of the exposure time period, the imaging device 934 can be configured to block radiation 954 and radiation 964 (e.g., "ghost" radiation reflected off of the pattern 910b and received from outside the second region) by deactivating or otherwise not exposing, during the second portion of the exposure time period, all rows or areas that are not adjacent to the second actively-exposed row or area. In some aspects, during the second portion of the exposure time period, the imaging device 934 can be configured to capture the radiation 944 and generate a second ROI sub-image based thereon.

As shown in FIG. 9C, in some aspects, the spatial electro-optic modulator 920 can be configured to transmit, during a third portion of the exposure time period of the imaging device 934, a radiation beam 940C through the optic 922 toward a third region of the surface 910a of the reticle 910. In some aspects, during the third portion of the exposure time period, the imaging device 934 can be configured to capture radiation 946 (e.g., radiation received from the third region) using a third actively-exposed row or area of the imaging device 934. In some aspects, during the third portion of the exposure time period, the imaging device 934 can be configured to capture the radiation 946 and generate a third ROI sub-image based thereon.

In some aspects, the imaging system 904 can be configured to generate, during the exposure time period, a composite image corresponding to the field of view of the imaging device 934. For example, during the exposure time period, the imaging system 904 can be configured to generate a composite image based on the first ROI sub-image, the second ROI sub-image, and the third ROI sub-image.

In some aspects, the imaging system 904 can record image data covering substantially the entire field of view of the imaging device 934 during a singular exposure event of the image detector of the imaging device 934. Using the above techniques during a single exposure event of the imaging device 934, substantially the entire field of view can be recorded during the single exposure event, which can result in increased throughput. For example, in one implementation of an ROI illumination-acquisition technique, the camera has to acquire as many images as the number of ROIs (e.g., three separate exposure events to capture three sub-images per field of view). In contrast, the example particle inspection system 900 utilizes the substantially higher speed of spatial electro-optic modulator (e.g., whose pixel activation/deactivation frequency is measured in tens of kHz) to scan objects under test within the frame time of the imaging device 934 (e.g., including twelve or more megapixels and configured to capture full-frame images at a rate of up to 300 frames per second) and thereby substantially increase throughput (e.g., only one exposure event to capture three sub-images per field of view).

Example Processes for Increasing the Throughput of a Particle Inspection System

Figure 10:
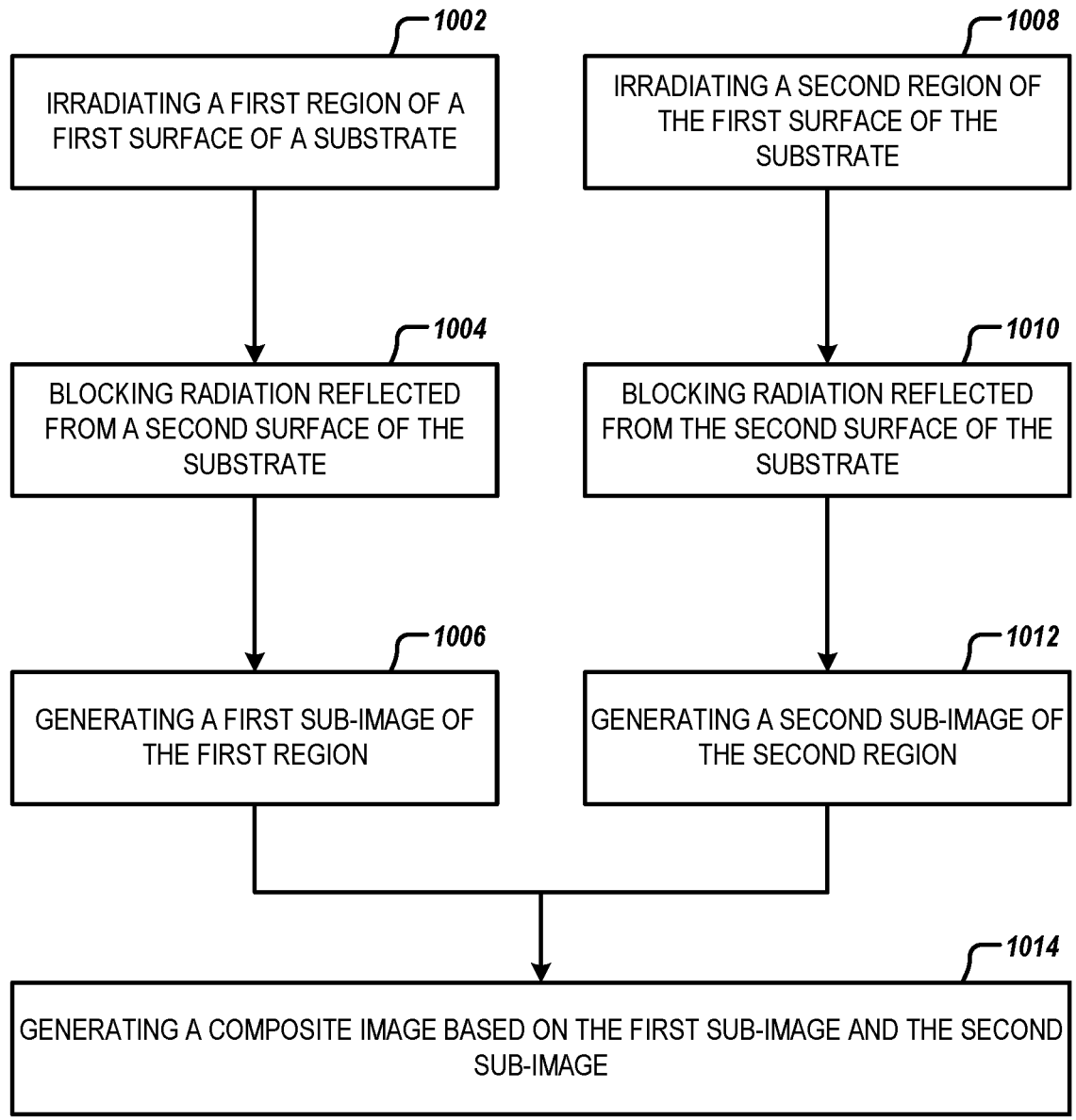
FIG. 10 is an example method for increasing the throughput of a particle inspection system according to some aspects of the present disclosure or portion(s) thereof.

FIG. 10 is an example method 1000 for increasing the throughput of a particle inspection system according to some aspects of the present disclosure or portion(s) thereof. The operations described with reference to example method 1000 can be performed by, or according to, any of the systems, apparatuses, components, techniques, or combinations thereof described herein, such as those described with reference to FIGS. 1-9 above and FIG. 11 below. In general, the example method 1000 can improve system throughput when the number of regions utilized for irradiation (e.g., illumination) and acquisition (e.g., capture, detection) is larger than one. Although only two regions are described with reference to FIG. 10, the example method 1000 can include using any number of sequentially irradiated and acquired regions, such as three or more regions.

At operation 1002, the method can include irradiating, by a radiation system (e.g., radiation system 402, 602, 902)

during a first portion (e.g., $\Delta t_{i,1}$) of an exposure time period (e.g., $\Delta t_i$), a first region of a first surface (e.g., surface 410*a*, 412*a*, 610*a*, 910*a*) of a substrate (e.g., substrate W; patterning device MA; reticle 410, 610, 910; pellicle 412).

In some aspects, the exposure time period can be an exposure time period of an imaging device (e.g., imaging device 634, 734, 834, 934; an imaging device included in the imaging system 404). In some aspects, a field of view of the imaging device during the exposure time period can include the first region of the first surface of the substrate and the second region of the first surface of the substrate. In some aspects, the first region can define a first rectangle, a first square, a first triangle, a first circle, any other suitable region, or any combination thereof. For example, the first region can be one of the regions 422, 424, 426, 462, 464, and 466; a first actively-exposed row of the imaging device 734; a first actively-exposed area of the imaging device 834; any other suitable region; or any combination thereof.

In some aspects, the irradiation of the first region can be accomplished using suitable mechanical or other methods and include irradiating the first region in accordance with any aspect or combination of aspects described with reference to FIGS. 1-9 above and FIG. 11 below.

At operation 1004, the method can include blocking, by a spatial filtering system during the first portion of the exposure time period, radiation reflected from a second surface (e.g., pattern 410*b*, 610*b*, 910*b*) of the substrate disposed opposite the first surface of the substrate. For example, during the first portion of the exposure time period, the method can include blocking, by the spatial filtering system, all reflected radiation outside the first region. In one illustrative example, the spatial filtering system can include a spatial electro-optic modulator (e.g., second spatial electro-optic modulator 630) configured to block the radiation reflected from the second surface of the substrate. In another illustrative example, the spatial filtering system can be implemented based on a rolling shutter acquisition mode of an imaging device (e.g., imaging device 734, 934). In yet another illustrative example, the spatial filtering system can be implemented based on an ROI acquisition mode of an imaging device (e.g., imaging device 834, 934). In some aspects, the blocked radiation can include one of the radiation 452, 454, 456, 492, 494, 496, 652, 654, 664, 952, 954, and 964; any other suitable radiation; or any combination thereof. In some aspects, the blocking of the radiation can be accomplished using suitable mechanical or other methods and include blocking the radiation in accordance with any aspect or combination of aspects described with reference to FIGS. 1-9 above and FIG. 11 below.

At operation 1006, the method can include generating, by an imaging system (e.g., imaging system 404, 604, 704, 804, 904) during the first portion of the exposure time period, a first sub-image of the first region of the first surface of the substrate. In some aspects, the generation of the first sub-image can be accomplished using suitable mechanical or other methods and include generating the first sub-image in accordance with any aspect or combination of aspects described with reference to FIGS. 1-9 above and FIG. 11 below.

At operation 1008, the method can include irradiating, by the radiation system during a second portion (e.g., $\Delta t_{i,2}$) of the exposure time period, a second region of the first surface of the substrate. In some aspects, the second region can define a second rectangle, a second square, a second triangle, a second circle, any other suitable region, or any combination thereof. For example, the second region can be another of the regions 422, 424, 426, 462, 464, and 466; a second actively-exposed row of imaging device 734; a second actively-exposed area of the imaging device 834; any other suitable region; or any combination thereof. In some aspects, the irradiation of the second region can be accomplished using suitable mechanical or other methods and include irradiating the second region in accordance with any aspect or combination of aspects described with reference to FIGS. 1-9 above and FIG. 11 below.

At operation 1010, the method can include blocking, by the spatial filtering system during the second portion of the exposure time period, radiation reflected from the second surface of the substrate. For example, during the second portion of the exposure time period, the method can include blocking, by the spatial filtering system, all reflected radiation outside the second region. In some aspects, the blocked radiation can include another of the radiation 452, 454, 456, 492, 494, 496, 652, 654, 664, 952, 954, and 964; any other suitable radiation; or any combination thereof. In some aspects, the blocking of the radiation can be accomplished using suitable mechanical or other methods and include blocking the radiation in accordance with any aspect or combination of aspects described with reference to FIGS. 1-9 above and FIG. 11 below.

At operation 1012, the method can include generating, by the imaging system during the second portion of the exposure time period, a second sub-image of the second region of the first surface of the substrate. In some aspects, the generation of the second sub-image can be accomplished using suitable mechanical or other methods and include generating the second sub-image in accordance with any aspect or combination of aspects described with reference to FIGS. 1-9 above and FIG. 11 below.

At operation 1014, the method can include generating, by the imaging system, a composite image based on the first sub-image and the second sub-image. In some aspects, the composite image can include the entire field of view of the imaging system. In some aspects, the generation of the composite image can be accomplished using suitable mechanical or other methods and include generating the composite image in accordance with any aspect or combination of aspects described with reference to FIGS. 1-9 above and FIG. 11 below.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 11:
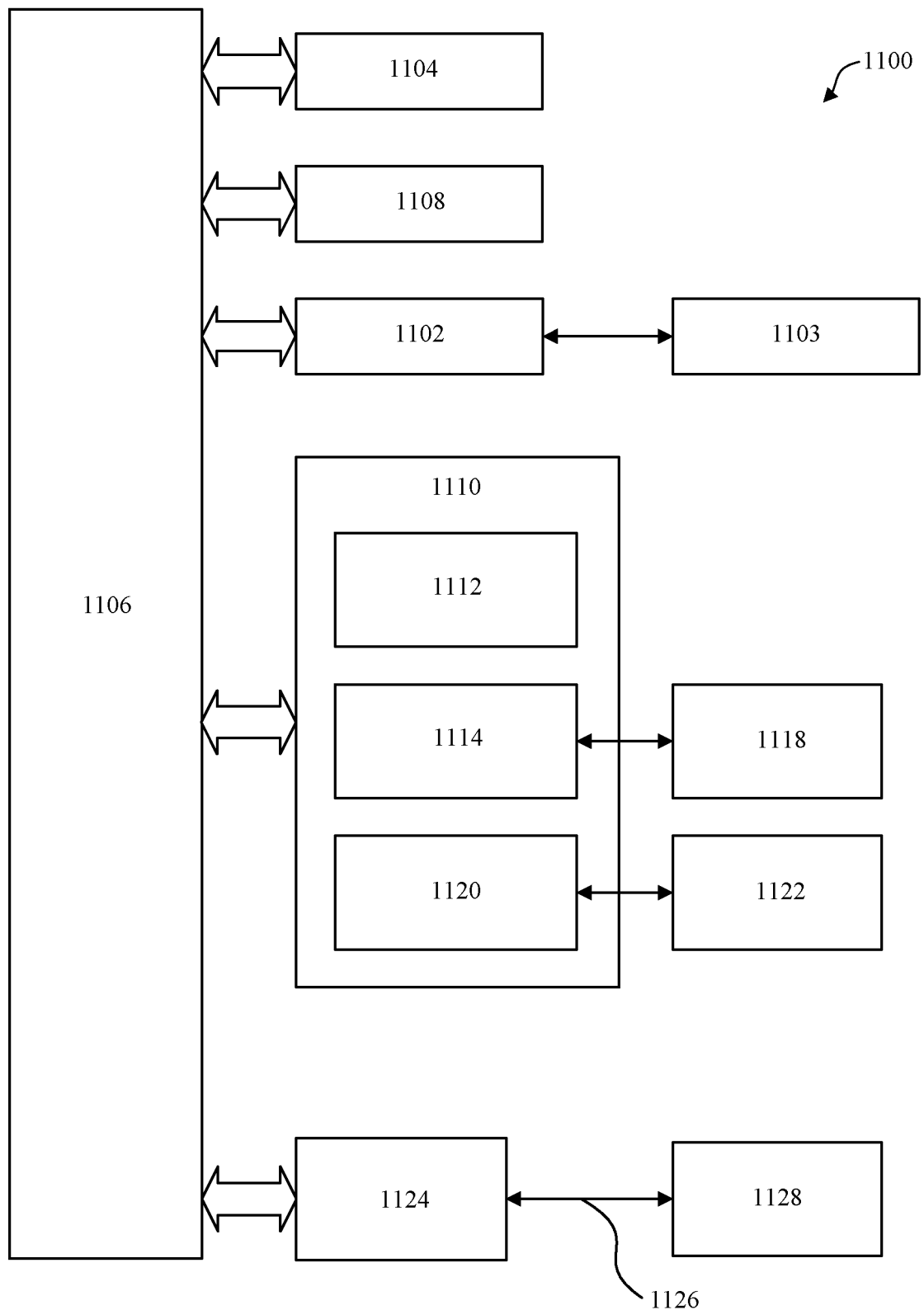
FIG. 11 is an example computer system for implementing some aspects of the present disclosure or portion(s) thereof.

Various aspects can be implemented, for example, using one or more computing systems, such as example computing system 1100 shown in FIG. 11. Example computing system 1100 can be a specialized computer capable of performing the functions described herein such as: the example particle inspection system 400 described with reference to FIGS. 4A, 4B, 4C, 4D, 4E, and 4F; the example particle inspection system 600 described with reference to FIGS. 6A, 6B, and 6C; the example particle inspection system 900 described with reference to FIGS. 9A, 9B, and 9C; any other suitable system, sub-system, or component; or any combination thereof. Example computing system 1100 can include one or more processors (also called central processing units, or CPUs), such as a processor 1104. Processor 1104 is connected to a communication infrastructure 1106 (e.g., a bus). Example computing system 1100 can also include user input/output device(s) 1103, such as monitors, keyboards, pointing devices, etc., that communicate with communication infrastructure 1106 through user input/output interface(s) 1102. Example computing system 1100 can also include a main memory 1108 (e.g., one or more primary storage devices), such as random access memory (RAM). Main memory 1108 can include one or more levels of cache. Main memory 1108 has stored therein control logic (e.g., computer software) and/or data.

Example computing system 1100 can also include a secondary memory 1110 (e.g., one or more secondary storage devices). Secondary memory 1110 can include, for example, a hard disk drive 1112 and/or a removable storage drive 1114. Removable storage drive 1114 can be a floppy disk drive, a magnetic tape drive, a compact disk drive, an optical storage device, tape backup device, and/or any other storage device/drive.

Removable storage drive 1114 can interact with a removable storage unit 1118. Removable storage unit 1118 includes a computer usable or readable storage device having stored thereon computer software (control logic) and/or data. Removable storage unit 1118 can be a floppy disk, magnetic tape, compact disk, DVD, optical storage disk, and/or any other computer data storage device. Removable storage drive 1114 reads from and/or writes to removable storage unit 1118.

According to some aspects, secondary memory 1110 can include other means, instrumentalities or other approaches for allowing computer programs and/or other instructions and/or data to be accessed by example computing system 1100. Such means, instrumentalities or other approaches can include, for example, a removable storage unit 1122 and an interface 1120. Examples of the removable storage unit 1122 and the interface 1120 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1100 can further include a communications interface 1124 (e.g., one or more network interfaces). Communications interface 1124 enables example computing system 1100 to communicate and interact with any combination of remote devices, remote networks, remote entities, etc. (individually and collectively referred to as remote devices 1128). For example, communications interface 1124 can allow example computing system 1100 to communicate with remote devices 1128 over communications path 1126, which can be wired and/or wireless, and which can include any combination of LANs, WANs, the Internet, etc. Control logic, data, or both can be transmitted to and from example computing system 1100 via communications path 1126.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1100, main memory 1108, secondary memory 1110 and removable storage units 1118 and 1122, as well as tangible articles of manufacture embodying any combination of the foregoing. Such control logic, when executed by one or more data processing devices (such as example computing system 1100), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 11. In particular, aspects of the disclosure can operate with software, hardware, and/or operating system implementations other than those described herein.

The embodiments may further be described using the following clauses:

1. A system, comprising:
   a radiation system configured to:
      transmit, during a first portion of an exposure time period, a first radiation beam toward a first region of a first surface of a substrate; and
      transmit, during a second portion of the exposure time period, a second radiation beam toward a second region of the first surface of the substrate;
   a spatial filtering system configured to:
      block radiation reflected from a second surface of the substrate disposed opposite the first surface of the substrate; and
   an imaging system configured to:
      capture, during the first portion of the exposure time period, a first sub-image of the first region based on first radiation scattered from the first region in response to a first irradiation of the first region by the first radiation beam;
      capture, during the second portion of the exposure time period, a second sub-image of the second region based on second radiation scattered from the second region in response to a second irradiation of the second region by the second radiation beam; and
      generate a composite image based on the first sub-image and the second sub-image.

2. The system of clause 1, wherein:
   the first radiation beam comprises a first spectrum;
   the second radiation beam comprises a second spectrum; and
   the first spectrum is about equal to the second spectrum.

3. The system of clause 2, wherein the first spectrum corresponds to a white light spectrum.

4. The system of clause 1, wherein the second region does not overlap the first region.

5. The system of clause 1, wherein:
   the first region defines a first rectangle, a first square, a first triangle, or a first circle; and the second region defines a second rectangle, a second square, a second triangle, or a second circle.

6. The system of clause 1, wherein the radiation system comprises:
a first radiation source configured to generate the first radiation beam; and
a second radiation source configured to generate the second radiation beam.

7. The system of clause 1, wherein the radiation system comprises:
a radiation source configured to:
generate the first radiation beam; and
generate the second radiation beam.

8. The system of clause 1, wherein:
the radiation system comprises a first spatial electro-optic modulator; and
the first spatial electro-optic modulator is configured to:
transmit, during the first portion of the exposure time period, the first radiation beam toward the first region of the first surface of the substrate; and
transmit, during the second portion of the exposure time period, the second radiation beam toward the second region of the first surface of the substrate.

9. The system of clause 8, wherein the first spatial electro-optic modulator comprises a set of slits.

10. The system of clause 9, wherein:
the spatial filtering system comprises a second spatial electro-optic modulator; and
the second spatial electro-optic modulator is configured to:
block the radiation reflected from the second surface of the substrate.

11. The system of clause 10, wherein the second spatial electro-optic modulator comprises a set of slits.

12. The system of clause 8, wherein:
the imaging system comprises:
the spatial filtering system; and
an imaging device.

13. The system of clause 12, wherein:
the exposure time is an exposure time of the imaging device; and
during the exposure time, a field of view of the imaging device comprises:
the first region of the first surface of the substrate; and
the second region of the first surface of the substrate.

14. The system of clause 12, wherein:
the spatial filtering system is implemented based on a rolling shutter acquisition mode of the imaging device.

15. The system of clause 14, wherein:
the first region defines a first line corresponding to a first actively-exposed row of the imaging device; and
the second region defines a second line corresponding to a second actively-exposed row of the imaging device.

16. The system of clause 12, wherein the spatial filtering system is implemented based on a region of interest (ROI) acquisition mode of the imaging device.

17. The system of clause 16, wherein:
the first region defines a first rectangular area corresponding to a first actively-exposed area of the imaging device; and
the second region defines a second rectangular area corresponding to a second actively-exposed area of the imaging device.

18. The system of clause 1, wherein:
the second region of the first surface of the substrate comprises a particle; and
the imaging system is further configured to detect the particle based on the composite image.

19. A lithographic apparatus, comprising:
a radiation system configured to:
transmit, during a first portion of an exposure time period, a first radiation beam toward a first region of a first surface of a substrate; and
transmit, during a second portion of the exposure time period, a second radiation beam toward a second region of the first surface of the substrate;
a spatial filtering system configured to:
block radiation reflected from a second surface of the substrate disposed opposite the first surface of the substrate; and
an imaging system configured to:
capture, during the first portion of the exposure time period, a first sub-image of the first region based on first radiation scattered from the first region in response to a first irradiation of the first region by the first radiation beam;
capture, during the second portion of the exposure time period, a second sub-image of the second region based on second radiation scattered from the second region in response to a second irradiation of the second region by the second radiation beam; and
generate a composite image based on the first sub-image and the second sub-image.

20. An apparatus, comprising:
a radiation system configured to:
emit, during a first portion of an exposure time period, a first radiation beam toward a first region of a first surface of a substrate at a first incident angle; and
emit, during a second portion of the exposure time period, a second radiation beam toward a second region of the first surface of the substrate at a second incident angle; and
an imaging system configured to:
block, during the first portion of the exposure time period, radiation reflected from a second surface of the substrate disposed opposite the first surface of the substrate;
capture, during the first portion of the exposure time period, a first sub-image of the first region of the first surface of the substrate;
capture, during the second portion of the exposure time period, a second sub-image of the second region of the first surface of the substrate; and
generate a composite image based on the first sub-image and the second sub-image.

21. A method, comprising:
irradiating, by a radiation system during a first portion of an exposure time period, a first region of a first surface of a substrate;
irradiating, by the radiation system during a second portion of the exposure time period, a second region of the first surface of the substrate;
blocking, by a spatial filtering system during the exposure time period, radiation reflected from a second surface of the substrate disposed opposite the first surface of the substrate;
generating, by an imaging system during the first portion of the exposure time period, a first sub-image of the first region of the first surface of the substrate;
generating, by the imaging system during the second portion of the exposure time period, a second sub-image of the second region of the first surface of the substrate; and generating, by the imaging system, a composite image based on the first sub-image and the second sub-image.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A system, comprising:
a radiation system configured to:
  transmit, during a first portion of an exposure time period, a first radiation beam toward a first region of a first surface of a substrate; and
  transmit, during a second portion of the exposure time period, a second radiation beam toward a second region of the first surface of the substrate;
a spatial filtering system configured to block radiation reflected from a second surface of the substrate disposed opposite the first surface of the substrate; and
an imaging system configured to:
  capture, during the first portion of the exposure time period, a first sub-image of the first region based on first radiation scattered from the first region in response to a first irradiation of the first region by the first radiation beam;
  capture, during the second portion of the exposure time period, a second sub-image of the second region based on second radiation scattered from the second region in response to a second irradiation of the second region by the second radiation beam; and
  generate a composite image by displaying the first sub-image and the second sub-image substantially simultaneously.

2. The system of claim 1, wherein:
the first radiation beam comprises a first spectrum;
the second radiation beam comprises a second spectrum;
the first spectrum is about equal to the second spectrum; and/or
the first spectrum corresponds to a white light spectrum.

3. The system of claim 1, wherein:
the first region defines a first rectangle, a first square, a first triangle, or a first circle;
the second region defines a second rectangle, a second square, a second triangle, or a second circle; and/or
the second region does not overlap the first region.

4. The system of claim 1, wherein the radiation system comprises:
a first radiation source configured to generate the first radiation beam; and
a second radiation source configured to generate the second radiation beam.

5. The system of claim 1, wherein the radiation system comprises:
a radiation source configured to:
  generate the first radiation beam; and
  generate the second radiation beam.

6. The system of claim 1, wherein:
the radiation system comprises a first spatial electro-optic modulator; and
the first spatial electro-optic modulator is configured to:
  transmit, during the first portion of the exposure time period, the first radiation beam toward the first region of the first surface of the substrate; and
  transmit, during the second portion of the exposure time period, the second radiation beam toward the second region of the first surface of the substrate.

7. The system of claim 6, wherein the first spatial electro-optic modulator comprises a set of slits.

8. The system of claim 6, wherein:
the spatial filtering system comprises a second spatial electro-optic modulator;
the second spatial electro-optic modulator is configured to block the radiation reflected from the second surface of the substrate; and/or the second spatial electro-optic modulator comprises a set of slits.

9. The system of claim 6, wherein the imaging system comprises:
the spatial filtering system; and
an imaging device.

10. The system of claim 9, wherein:
the exposure time period is an exposure time period of the imaging device;
during the exposure time period, a field of view of the imaging device comprises:
the first region of the first surface of the substrate; and
the second region of the first surface of the substrate; and/or
the spatial filtering system is implemented based on a rolling shutter acquisition mode of the imaging device.

11. The system of claim 10, wherein:
the first region defines a first line corresponding to a first actively-exposed row of the imaging device; and
the second region defines a second line corresponding to a second actively-exposed row of the imaging device.

12. The system of claim 9, wherein the spatial filtering system is implemented based on a region of interest (ROI) acquisition mode of the imaging device and/or:
the first region defines a first rectangular area corresponding to a first actively-exposed area of the imaging device; and
the second region defines a second rectangular area corresponding to a second actively-exposed area of the imaging device.

13. The system of claim 1, wherein:
the second region of the first surface of the substrate comprises a particle; and
the imaging system is further configured to detect the particle based on the composite image.

14. A lithographic apparatus, comprising:
a radiation system configured to:
transmit, during a first portion of an exposure time period, a first radiation beam toward a first region of a first surface of a substrate; and
transmit, during a second portion of the exposure time period, a second radiation beam toward a second region of the first surface of the substrate;
a spatial filtering system configured to block radiation reflected from a second surface of the substrate disposed opposite the first surface of the substrate; and
an imaging system configured to:
capture, during the first portion of the exposure time period, a first sub-image of the first region based on first radiation scattered from the first region in response to a first irradiation of the first region by the first radiation beam;
capture, during the second portion of the exposure time period, a second sub-image of the second region based on second radiation scattered from the second region in response to a second irradiation of the second region by the second radiation beam; and
generate a composite image by displaying the first sub-image and the second sub-image substantially simultaneously.

15. An apparatus, comprising:
a radiation system configured to:
emit, during a first portion of an exposure time period, a first radiation beam toward a first region of a first surface of a substrate at a first incident angle; and
emit, during a second portion of the exposure time period, a second radiation beam toward a second region of the first surface of the substrate at a second incident angle; and
an imaging system configured to:
block, during the first portion of the exposure time period, radiation reflected from a second surface of the substrate disposed opposite the first surface of the substrate;
capture, during the first portion of the exposure time period, a first sub-image of the first region of the first surface of the substrate;
capture, during the second portion of the exposure time period, a second sub-image of the second region of the first surface of the substrate; and
generate a composite image by displaying the first sub-image and the second sub-image substantially simultaneously.

16. The system of claim 1, wherein the spatial filtering system comprises at least one optical element.

17. The system of claim 16, wherein the at least one optical element is a lens configured to receive all radiation scattered from the first region and the second region.

18. The system of claim 16, wherein the at least one optical element is a folding mirror.

19. The system of claim 16, wherein the at least one optical element comprises a plurality of optical elements working in combination.

20. The system of claim 1, wherein the spatial filtering system comprises a rolling shutter acquisition mode or a region of interest (ROI) acquisition mode of the imaging system.

* * * * *